(12) United States Patent
Yin et al.

(10) Patent No.: US 8,187,905 B2
(45) Date of Patent: May 29, 2012

(54) METHOD OF FORMING A MICROLENS AND A METHOD FOR MANUFACTURING AN IMAGE SENSOR

(75) Inventors: Huaxiang Yin, Yongin-si (KR); Hyuck Lim, Yongin-si (KR); Young-soo Park, Yongin-si (KR); Wenxu Xianyu, Yongin-si (KR); Hans S. Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/805,821

(22) Filed: Aug. 20, 2010

(65) Prior Publication Data

US 2011/0008920 A1 Jan. 13, 2011

Related U.S. Application Data

(62) Division of application No. 12/662,607, filed on Apr. 26, 2010.

(30) Foreign Application Priority Data

Jul. 26, 2006 (KR) .................. 10-2006-0070296

(51) Int. Cl.
*H01L 31/062* (2006.01)
*H01L 31/107* (2006.01)

(52) U.S. Cl. .............. 438/57; 438/7; 438/70; 438/97; 438/488; 438/684; 257/233; 257/294; 257/431; 257/432; 257/435; 257/E31.043; 257/E27.133

(58) Field of Classification Search .............. 438/7, 22, 438/27–28, 48, 57, 60, 69–70, 75, 97, 482, 438/486, 488, 489, 584, 597, 660–663, 684; 257/72, 98, 225, 233, 291, 292, 294, 432, 257/435, E21.592, E27.133, E27.134, E27.141, 257/E29.282

See application file for complete search history.

(56) References Cited

U.S. PATENT DOCUMENTS 6,001,540 A * 12/1999 Huang et al. .................. 430/321
(Continued)

FOREIGN PATENT DOCUMENTS

JP 2002-217206 A 8/2002
(Continued)

*Primary Examiner* — Matthew Landau
*Assistant Examiner* — Maliheh Malek
(74) *Attorney, Agent, or Firm* — Harness, Dickey & Pierce, P.L.C.

(57) ABSTRACT

A microlens, an image sensor including the microlens, a method of forming the microlens and a method of manufacturing the image sensor are provided. The microlens includes a polysilicon pattern, having a cylindrical shape, formed on a substrate, and a round-type shell portion enclosing the polysilicon pattern. The microlens may further include a filler material filling an interior of the shell portion, or a second shell portion covering the first shell portion. The method of forming a microlens includes forming a silicon pattern on a semiconductor substrate having a lower structure, forming a capping film on the semiconductor substrate over the silicon pattern, annealing the silicon pattern and the capping film altering the silicon pattern to a polysilicon pattern having a cylindrical shape and the capping film to a shell portion for a round-type microlens, and filling an interior of the shell portion with a lens material through an opening between the semiconductor substrate and an edge of the shell portion. The image sensor includes a microlens formed by a similar method and a photodiode having a cylindrical shape.

30 Claims, 21 Drawing Sheets

U.S. PATENT DOCUMENTS

| | | | | |
|---|---|---|---|---|
| 6,157,017 A * | 12/2000 | Kim | ............ | 250/208.1 |
| 6,171,883 B1 * | 1/2001 | Fan et al. | ............ | 438/65 |
| 6,252,218 B1 * | 6/2001 | Chou | ............ | 250/208.1 |
| 6,255,640 B1 * | 7/2001 | Endo et al. | ............ | 250/208.1 |
| 6,362,498 B2 * | 3/2002 | Abramovich | ............ | 257/233 |
| 6,414,343 B1 * | 7/2002 | Kondo et al. | ............ | 257/294 |
| 6,577,342 B1 * | 6/2003 | Wester | ............ | 348/340 |
| 6,583,438 B1 * | 6/2003 | Uchida | ............ | 257/59 |
| 6,605,851 B2 * | 8/2003 | Kim | ............ | 257/432 |
| 6,614,479 B1 * | 9/2003 | Fukusho et al. | ............ | 348/340 |
| 6,617,189 B1 * | 9/2003 | Chen et al. | ............ | 438/48 |
| 6,734,031 B2 * | 5/2004 | Shizukuishi | ............ | 438/22 |
| 6,831,311 B2 * | 12/2004 | Uchida | ............ | 257/290 |
| 6,861,280 B2 * | 3/2005 | Yamamoto | ............ | 438/70 |
| 6,903,395 B2 * | 6/2005 | Nakai et al. | ............ | 257/294 |
| 6,933,161 B2 * | 8/2005 | Kim | ............ | 438/27 |
| 7,253,087 B2 * | 8/2007 | Utsunomiya | ............ | 438/598 |
| 7,262,072 B2 * | 8/2007 | Kim | ............ | 438/57 |
| 7,265,402 B2 * | 9/2007 | Koyanagi | ............ | 257/292 |
| 7,294,389 B2 * | 11/2007 | Teshima et al. | ............ | 428/209 |
| 7,307,788 B2 * | 12/2007 | Boettiger et al. | ............ | 359/619 |
| 7,432,530 B2 * | 10/2008 | Yamashita et al. | ............ | 257/72 |
| 7,488,615 B2 * | 2/2009 | Uya | ............ | 438/48 |
| 7,491,993 B2 * | 2/2009 | Kim | ............ | 257/294 |
| 7,508,044 B2 * | 3/2009 | Kasama et al. | ............ | 257/431 |
| 7,525,139 B2 * | 4/2009 | Yang et al. | ............ | 257/294 |
| 7,750,424 B2 * | 7/2010 | Yin et al. | ............ | 257/432 |
| 7,829,361 B2 * | 11/2010 | Wells | ............ | 438/48 |
| 7,842,994 B2 * | 11/2010 | Yin et al. | ............ | 257/316 |
| 7,916,204 B2 * | 3/2011 | Wells et al. | ............ | 348/340 |
| 7,928,527 B2 * | 4/2011 | Gambino et al. | ............ | 257/432 |
| 8,013,409 B2 * | 9/2011 | Itahashi | ............ | 257/432 |
| 2001/0033007 A1 * | 10/2001 | Lee | ............ | 257/432 |
| 2002/0045285 A1 * | 4/2002 | Ushijima et al. | ............ | 438/29 |
| 2003/0063204 A1 * | 4/2003 | Suda | ............ | 348/272 |
| 2003/0168679 A1 * | 9/2003 | Nakai et al. | ............ | 257/291 |
| 2003/0197210 A1 * | 10/2003 | Uchida | ............ | 257/294 |
| 2004/0016983 A1 * | 1/2004 | Misawa | ............ | 257/433 |
| 2004/0033640 A1 * | 2/2004 | Izumi et al. | ............ | 438/59 |
| 2004/0084700 A1 * | 5/2004 | Kim | ............ | 257/292 |
| 2004/0142501 A1 * | 7/2004 | Nakai et al. | ............ | 438/22 |
| 2005/0012166 A1 * | 1/2005 | Choi | ............ | 257/414 |
| 2005/0029643 A1 * | 2/2005 | Koyanagi | ............ | 257/680 |
| 2005/0032338 A1 * | 2/2005 | Chen | ............ | 438/486 |
| 2005/0052562 A1 * | 3/2005 | Shimizu et al. | ............ | 348/340 |
| 2005/0122417 A1 * | 6/2005 | Suzuki | ............ | 348/340 |
| 2005/0139750 A1 * | 6/2005 | Dobashi et al. | ............ | 250/208.1 |
| 2005/0142689 A1 * | 6/2005 | Kim | ............ | 438/69 |
| 2005/0208692 A1 * | 9/2005 | Lee | ............ | 438/29 |
| 2005/0242271 A1 * | 11/2005 | Weng et al. | ............ | 250/214.1 |
| 2006/0006438 A1 * | 1/2006 | Maruyama | ............ | 257/294 |
| 2006/0006485 A1 * | 1/2006 | Mouli | ............ | 257/432 |
| 2006/0043515 A1 * | 3/2006 | Ford | ............ | 257/436 |
| 2006/0049439 A1 * | 3/2006 | Oh et al. | ............ | 257/292 |
| 2006/0076636 A1 * | 4/2006 | Fukunaga | ............ | 257/432 |
| 2006/0115230 A1 * | 6/2006 | Komoguchi et al. | ............ | 385/146 |
| 2006/0119950 A1 * | 6/2006 | Boettiger et al. | ............ | 359/626 |
| 2006/0138495 A1 * | 6/2006 | Li et al. | ............ | 257/292 |
| 2006/0145197 A1 * | 7/2006 | Baek | ............ | 257/222 |
| 2006/0145202 A1 * | 7/2006 | Sawase et al. | ............ | 257/291 |
| 2006/0170069 A1 * | 8/2006 | Kim | ............ | 257/432 |
| 2006/0187381 A1 * | 8/2006 | Yokozawa | ............ | 349/106 |
| 2006/0192083 A1 * | 8/2006 | Fu et al. | ............ | 250/214.1 |
| 2006/0249804 A1 * | 11/2006 | Mouli | ............ | 257/432 |
| 2006/0261342 A1 * | 11/2006 | Wells | ............ | 257/72 |
| 2006/0261427 A1 * | 11/2006 | Dillon et al. | ............ | 257/432 |
| 2007/0001252 A1 * | 1/2007 | Noda et al. | ............ | 257/432 |
| 2007/0058055 A1 * | 3/2007 | Yamaguchi et al. | ............ | 348/272 |
| 2007/0063126 A1 * | 3/2007 | Lee | ............ | 250/208.1 |
| 2007/0090274 A1 * | 4/2007 | Lee et al. | ............ | 250/208.1 |
| 2007/0145437 A1 * | 6/2007 | Kim | ............ | 257/290 |
| 2007/0145504 A1 * | 6/2007 | Kim | ............ | 257/432 |
| 2007/0152246 A1 * | 7/2007 | Im | ............ | 257/290 |
| 2007/0170477 A1 * | 7/2007 | Kuriyama et al. | ............ | 257/292 |
| 2007/0172970 A1 * | 7/2007 | Uya | ............ | 438/22 |
| 2007/0172974 A1 * | 7/2007 | Kim | ............ | 438/48 |
| 2007/0187793 A1 * | 8/2007 | Moon et al. | ............ | 257/440 |
| 2007/0200055 A1 * | 8/2007 | Reznik et al. | ............ | 250/208.1 |
| 2007/0228965 A1 * | 10/2007 | Cha et al. | ............ | 313/582 |
| 2007/0235771 A1 * | 10/2007 | Liu | ............ | 257/223 |
| 2007/0284687 A1 * | 12/2007 | Rantala | ............ | 257/432 |
| 2007/0298533 A1 * | 12/2007 | Yang et al. | ............ | 438/57 |
| 2008/0002460 A1 * | 1/2008 | Tuckerman et al. | ............ | 365/158 |
| 2008/0026547 A1 * | 1/2008 | Yin et al. | ............ | 438/486 |
| 2008/0035604 A1 * | 2/2008 | Tsukamoto | ............ | 216/26 |
| 2008/0143859 A1 * | 6/2008 | Wells | ............ | 348/294 |
| 2008/0191247 A1 * | 8/2008 | Yin et al. | ............ | 257/204 |
| 2008/0237684 A1 * | 10/2008 | Specht et al. | ............ | 257/316 |
| 2008/0265353 A1 * | 10/2008 | Komoguchi et al. | ............ | 257/432 |
| 2008/0293180 A1 * | 11/2008 | Mouli | ............ | 438/69 |
| 2009/0001400 A1 * | 1/2009 | Kim et al. | ............ | 257/98 |
| 2009/0085135 A1 * | 4/2009 | Bang | ............ | 257/432 |
| 2009/0090937 A1 * | 4/2009 | Park | ............ | 257/252 |
| 2009/0101946 A1 * | 4/2009 | Hwang | ............ | 257/290 |
| 2009/0104729 A1 * | 4/2009 | Koizumi et al. | ............ | 438/69 |
| 2009/0136174 A1 * | 5/2009 | Itahashi | ............ | 385/14 |
| 2009/0152603 A1 * | 6/2009 | Kim | ............ | 257/292 |
| 2009/0176328 A1 * | 7/2009 | Makita | ............ | 438/69 |
| 2009/0179289 A1 * | 7/2009 | Park | ............ | 257/432 |
| 2009/0200589 A1 * | 8/2009 | Qian et al. | ............ | 257/292 |
| 2009/0273008 A1 * | 11/2009 | Moon | ............ | 257/225 |
| 2009/0273046 A1 * | 11/2009 | Inaba et al. | ............ | 257/432 |
| 2011/0133060 A1 * | 6/2011 | Yu et al. | ............ | 250/214.1 |
| 2011/0143469 A1 * | 6/2011 | Nakamura et al. | ............ | 438/30 |

FOREIGN PATENT DOCUMENTS

| | | |
|---|---|---|
| JP | 2005-101452 A | 4/2005 |
| JP | 2005-156991 A | 6/2005 |
| KR | 1020060038146 A | 5/2006 |

* cited by examiner a-Si poly-Si

METHOD OF FORMING A MICROLENS AND A METHOD FOR MANUFACTURING AN IMAGE SENSOR

PRIORITY STATEMENT

This application is a divisional of U.S. application Ser. No. 12/662,607 filed Apr. 26, 2010, which claims priority to U.S. application Ser. No. 11/819,386 filed Jun. 27, 2007, which claims the benefit of priority under 35 U.S.C. §119 from Korean Patent Application No. 10-2006-0070296, filed on Jul. 26, 2006, in the Korean Intellectual Property Office (KIPO), the entire contents of each of which are incorporated herein by reference.

BACKGROUND

1. Field

Example embodiments relate to an image sensor including a microlens, an image sensor including the microlens, a method of forming the microlens and a method of manufacturing the image sensor. Other example embodiments relate to a method of forming a microlens which increases an optical efficiency, a microlens capable of increasing optical efficiency, an image sensor including the microlens and a method of manufacturing the image sensor.

2. Description of the Related Art

Microlenses are used in a variety of fields (e.g., image sensors, liquid crystal display (LCD) devices and optical communications systems). Microlenses can be used as an objective lens to record or reproduce information with respect to an optical disk drive (ODD) (e.g., a compact disk (CD) or digital versatile disk (DVD)).

An image sensor including a microlens is a semiconductor device used to convert an optical image to an electric signal. The conventional image sensor with the microlens may include a charge coupled device (CCD) and a complimentary metal oxide semiconductor (CMOS) image sensor.

The CCD has a plurality of MOS capacitors arranged in proximity to each other. The CCD operates by storing electric charges (carriers) generated by light in the MOS capacitors or by the movement of electric charges between the MOS capacitors. The CMOS image sensor utilizes CMOS technology wherein a control circuit and a signal processing circuit function as a peripheral circuit. The CMOS image sensor includes a plurality of unit pixels and a CMOS circuit that controls the output signals of the unit pixels.

FIG. 1 is a diagram illustrating a partial cross-sectional view of a conventional CMOS image sensor.

Referring to FIG. 1, the conventional CMOS image sensor includes an isolation layer (not shown) defining an active area on a semiconductor substrate SUB and a photodiode PD between the device isolation layers. The photodiode PD receives incident light and stores electric charges.

A first interlayer dielectric film $ILD_1$ is formed on the surface of the semiconductor substrate SUB where the device isolation layer and the photodiode PD are formed. Although not illustrated, the first interlayer dielectric film $ILD_1$ may be formed in a multi-layer structure. A metal wiring M, forming a unit pixel, is provided (or formed) in the first interlayer dielectric film $ILD_1$. The metal wiring M is provided (or formed) such that it does not block the light incident on the photodiode PD. The metal wiring M may be formed in a multi-layer structure.

A color filter layer CF, having sections dyed in red, green and/or blue, is formed on the first interlayer dielectric film $ILD_1$ over the photodiode PD. A second interlayer dielectric film $ILD_2$ is formed on the color filter layer CF and a portion of the first interlayer dielectric film $ILD_1$. The second interlayer dielectric film $ILD_2$ functions as an overcoat layer to overcome step and/or adjust the focal length of a microlens.

A round-type microlens ML is formed on the second interlayer dielectric film $ILD_2$ over the photodiode PD. The microlens ML functions by concentrating the incident light on the photodiode PD.

Although not illustrated, a protection film may be further provided on the first interlayer dielectric film $ILD_1$ to protect the photodiode PD and metal wiring M from the degradation due to the intrusion of external moisture. A planarization layer may be provided on the protection layer to overcome step and/or increase adhesiveness.

In the conventional image sensor, the optical efficiency is degraded because a dead zone (an area where light cannot be concentrated) exists between the microlenses. The dead zone is generated during the formation of the microlens as described below.

FIGS. 2A through 2C are diagrams illustrating cross-sectional views of a method of forming a conventional microlens.

Referring to FIG. 2A, an interlayer dielectric film ILD, which functions as an overcoat layer, is formed on a semiconductor substrate (not shown) having a desired lower structure (not shown). A photoresist layer PR is coated over the interlayer dielectric film ILD.

Referring to FIG. 2B, a desired area of the photoresist layer PR (e.g., an area other than an area for forming a microlens) is exposed. The area is developed with a developer to form a photoresist pattern PRP.

Referring to FIG. 2C, the photoresist pattern PRP is allowed to reflow at a temperature greater than a glass transition temperature Tg (e.g., 120° C.-200° C.) to form a round-type microlens ML.

As described above, the microlens ML may be formed in a reflow process using photoresist. Due to the limits in resolution of exposure equipment, it is difficult to decrease the area between the photoresist pattern PRP less than a predetermined value. As the area between neighboring microlens ML increases, a dead zone forms.

In the conventional image sensor, the light concentration of the microlens ML is degraded if the incident light is inclined. If the incident light is input inclined, then a portion of the incident light passing through the microlens ML may not reach the photodiode PD corresponding thereto, causing the image sensor to malfunction.

SUMMARY

Example embodiments relate to a microlens, an image sensor including the microlens, a method of forming the microlens and a method of manufacturing the image sensor. Other example embodiments relate to a method of forming a microlens which increases optical efficiency, a microlens capable of increasing optical efficiency, an image sensor including the microlens and a method of manufacturing the image sensor.

Example embodiments provide a method of forming a microlens which decreases the optical efficiency degradation caused by the formation of a dead zone in an image sensor and simultaneously increases the light concentration. Example embodiments provide a microlens including a polysilicon pattern formed on a semiconductor substrate, a round-type shell portion for the microlens, wherein the round-type shell portion encloses the polysilicon pattern, and a filler material filling an interior of the shell portion. The polysilicon pattern may have a cylindrical shape.

According to other example embodiments, a microlens including a polysilicon pattern formed on a semiconductor substrate, a round-type first shell portion for the microlens, wherein the round-type first shell portion encloses the polysilicon pattern, and a second shell portion covering the first shell portion is provided. The polysilicon pattern may have a cylindrical shape.

According example embodiments, a method of forming a microlens includes forming a silicon pattern on a semiconductor substrate having a lower structure, forming a capping film on the semiconductor substrate over (or covering) the silicon pattern, annealing the silicon pattern and the capping film to change (or alter) the silicon pattern to a polysilicon pattern having a cylindrical shape and the capping film to a shell portion for a round-type microlens, and filling the interior of the shell portion with a lens material through an opening between the semiconductor substrate and an edge of the shell portion generated (or formed) during the change (or altering) of the capping film to the shell portion.

According to other example embodiments, a method of forming a microlens includes forming a silicon pattern on a semiconductor substrate having a lower structure, forming a capping film on the semiconductor substrate over (or covering) the silicon pattern, annealing the silicon pattern and the capping film to change (or alter) the silicon pattern to a polysilicon pattern having a cylindrical shape and the capping film to a first shell portion for a round-type microlens, and forming a second shell portion for the microlens over (or covering) the first shell portion.

According to other example embodiments, a method of forming a microlens includes forming an interlayer dielectric film having a contact hole on a semiconductor substrate, forming a silicon plug in the contact hole, forming a silicon pattern on the contact hole and the interlayer dielectric film around (or covering) the contact hole, forming a capping film on the interlayer dielectric film over (or covering) the silicon pattern, annealing the silicon pattern, the silicon plug, and the capping film to change (or alter) the silicon pattern to a polysilicon pattern having a cylindrical shape and the capping film to a shell portion for a round-type microlens, and filling the interior of the shell portion with a lens material through an opening between the semiconductor substrate and an edge of the shell portion generated (or formed) during the change (or altering) of the capping film to the shell portion.

According to yet other example embodiments, a method of forming a microlens includes forming an interlayer dielectric film having a contact hole on a semiconductor substrate, forming a silicon plug in the contact hole, forming a silicon pattern on the contact hole and the interlayer dielectric film around (or covering) the contact hole, forming a capping film on the interlayer dielectric film over (or covering) the silicon pattern, annealing the silicon pattern, the silicon plug, and the capping film to change (or alter) the silicon pattern to a polysilicon pattern having a pole (or cylindrical) shape and the capping film to a first shell portion for a round-type microlens, and forming a second shell portion for the microlens on the interlayer dielectric film to cover (or around) the first shell portion.

The silicon pattern and the silicon plug may be formed of amorphous silicon or polysilicon. The silicon pattern may have a width of 10 Å-50000 Å. The silicon pattern may have a thickness of 10 Å-50000 Å.

The capping film may be formed of silicon oxide or zirconium oxide.

Annealing may include excimer laser annealing. Annealing may be performed at an intensity of 100 mJ/cm$^2$-3000 mJ/cm$^2$.

The polysilicon pattern having the pole (or cylindrical) shape may have a width less than a width of the silicon pattern. The polysilicon pattern may have a height greater than a height of the silicon pattern.

The lens material filling (or formed in) the interior of the shell portion may be a silicon oxide film or a photoresist film.

The second shell portion may be formed of silicon oxide or zirconium oxide.

According to example embodiments, an image sensor includes a semiconductor substrate, a first portion of a photodiode formed by doping impurities in a surface of the semiconductor substrate, an interlayer dielectric film formed on the semiconductor substrate and having a contact hole partially exposing the first portion of the photodiode, a second portion of the photodiode formed of doped polysilicon on the contact hole and having a height greater than a height of the interlayer dielectric film, a round-type first microlens formed on the interlayer dielectric film over (or covering) the second portion of the photodiode, and a color filter layer formed on the first microlens.

The microlens may include a shell portion and an interior portion. The interior portion may be filled with a lens material. In other example embodiments, the interior portion may be empty.

The first microlens may include a round-type shell portion formed on an upper surface of the second portion of the photodiode. The first microlens may have an edge separated from the interlayer dielectric film and a filler material filling the interior portion. The round-type shell portion may be formed of silicon oxide or zirconium oxide. The filler material may be formed of silicon oxide or photoresist.

The microlens may include a round-type first shell portion formed on an upper surface of the second portion of photodiode. The microlens may have an edge separated from the interlayer dielectric film. The microlens may have a second shell portion formed on the first shell portion and the interlayer dielectric film around the first shell portion. The first shell portion may be formed of silicon oxide or zirconium oxide. The second shell portion may be formed of silicon oxide or zirconium oxide.

A color filter layer may be formed on a surface of the first microlens. The color filter layer may not contact the first microlens. Another interlayer dielectric film may be interposed between the color filter layer and the first microlens.

The image sensor may include a second microlens formed on the color filter layer with a dielectric film interposed therebetween. The image sensor may include a dielectric film formed on the interlayer dielectric film to cover (or over) the color filter layer, a polysilicon pattern having a cylindrical shape formed on the dielectric film over the second portion of the photodiode, and a round-type second microlens formed on the dielectric film over (or covering) the polysilicon pattern.

The second microlens may include a shell portion and an interior portion. The interior portion may be filled with a lens material or may be empty. The structure and material thereof are the same as the above-described microlens.

According to example embodiments, a method of manufacturing an image sensor includes forming a first portion of a photodiode by doping impurities in a surface of a semiconductor substrate, forming a first interlayer dielectric film having a contact hole partially exposing the first portion of the photodiode on the semiconductor substrate, forming a silicon plug in the contact hole and a first silicon pattern (having a first height and a width greater than a diameter of the contact hole) on the contact hole and the first interlayer dielectric film, forming a first capping film on the first interlayer dielectric film to cover (or over) the first silicon pattern, annealing the first silicon pattern, the silicon plug, and the first capping film to change (or alter) the first silicon pattern and the silicon plug to a first polysilicon pattern and the first capping film to a shell portion for a round-type first microlens wherein the first polysilicon pattern has a second height greater than the first height and functions as a second portion of the photodiode, and filling the interior of the shell portion with a lens material through an opening between the first interlayer dielectric film and an edge of the shell portion formed during the change of the capping film to the shell portion, and forming a color filter layer on the shell portion.

According to example embodiments, a method of manufacturing an image sensor includes forming a first portion of a photodiode by doping impurities in the surface of a semiconductor substrate, forming a first interlayer dielectric film having a contact hole partially exposing the first portion of the photodiode on the semiconductor substrate, forming a silicon plug in the contact hole and a first silicon pattern (having a first height and a width greater than the diameter of the contact hole) on the contact hole and the first interlayer dielectric film, forming a first capping film on the first interlayer dielectric film over the silicon pattern, annealing the first silicon pattern, the silicon plug and the first capping film to form a first polysilicon pattern from the first silicon pattern and the silicon plug and the first capping film to a first shell portion for a round-type first microlens wherein the first polysilicon pattern has a second height greater than the first height and functions as a second portion of the photodiode, forming a second shell portion for the first microlens on the first shell portion and the interlayer film, and forming a color filter layer on the second shell portion.

The silicon plug may be formed of amorphous silicon or polysilicon. The silicon pattern may be formed of amorphous silicon or polysilicon. The silicon pattern has a width of 10 Å-50000 Å. The silicon pattern has a thickness of 10 Å-50000 Å.

The capping film may be formed of silicon oxide or zirconium oxide. The lens material filling (or positioned in) the interior of the shell portion for the second microlens may be a silicon oxide film or a photoresist film. The second shell portion may be formed of silicon oxide or zirconium oxide.

Annealing may include excimer laser annealing performed at an intensity of 100 mJ/cm$^2$-3000 mJ/cm$^2$.

After forming the color filter layer, a dielectric film may be formed on the interlayer dielectric film over (or covering) the color filter layer. A second silicon pattern may be formed on the dielectric film over the first silicon pattern. A second capping film may be formed on the second silicon pattern. The second silicon pattern and the second capping film may be annealed to change (or alter) the second silicon pattern to a second polysilicon pattern having a cylindrical shape and the second capping film to a first shell portion for a round-type second microlens. A second shell portion for the second microlens may be formed on the first shell portion for the second microlens and the dielectric film around the first shell portion.

The second silicon pattern may be formed of amorphous silicon or polysilicon. The second silicon pattern may be formed having a width of 10 Å-50000 Å. The second silicon pattern may have a thickness of 10 Å-50000 Å.

The second capping film may be formed of silicon oxide or zirconium oxide. The second polysilicon pattern having the shape of a cylindrical may have a smaller width and a greater height than the second silicon pattern. The second shell portion for the second microlens may be a silicon oxide film or a zirconium oxide film.

Annealing may include excimer laser annealing performed at an intensity of 100 mJ/cm$^2$-3000 mJ/cm$^2$.

BRIEF DESCRIPTION OF THE DRAWINGS

Example embodiments will be more clearly understood from the following detailed description taken in conjunction with the accompanying drawings. FIGS. 1-18 represent non-limiting, example embodiments as described herein.

FIG. 1 is a diagram illustrating a partial cross-sectional view of a conventional CMOS image sensor;

FIG. 6 is a diagram illustrating a cross-sectional view of a method of forming a microlens according to example embodiments;

FIG. 8 is a diagram illustrating a cross-sectional view of a method of forming a microlens according to example embodiments;

FIG. 9 is a diagram illustrating a partial cross-sectional view of an image sensor according to example embodiments;

FIG. 10 is a diagram illustrating a partial cross-sectional view of an image sensor according to example embodiments;

FIG. 11 is a diagram illustrating a partial cross-sectional view of an image sensor according to example embodiments;

FIG. 13 is a diagram illustrating a plan view image of an amorphous silicon pattern before excimer laser annealing (ELA) is performed;

FIG. 14 is a diagram illustrating a plan view image of a polysilicon pattern formed by ELA-the amorphous silicon pattern of FIG. 13 at an intensity of 950 mJ/cm$^2$;

FIG. 15 is a diagram illustrating a cross-sectional view of the polysilicon pattern and a shell portion for a microlens formed according to an example embodiment;

FIG. 18 is a diagram illustrating a partial cross-sectional view of an image sensor according to example embodiments.

DETAILED DESCRIPTION OF EXAMPLE EMBODIMENTS

Figure 1:
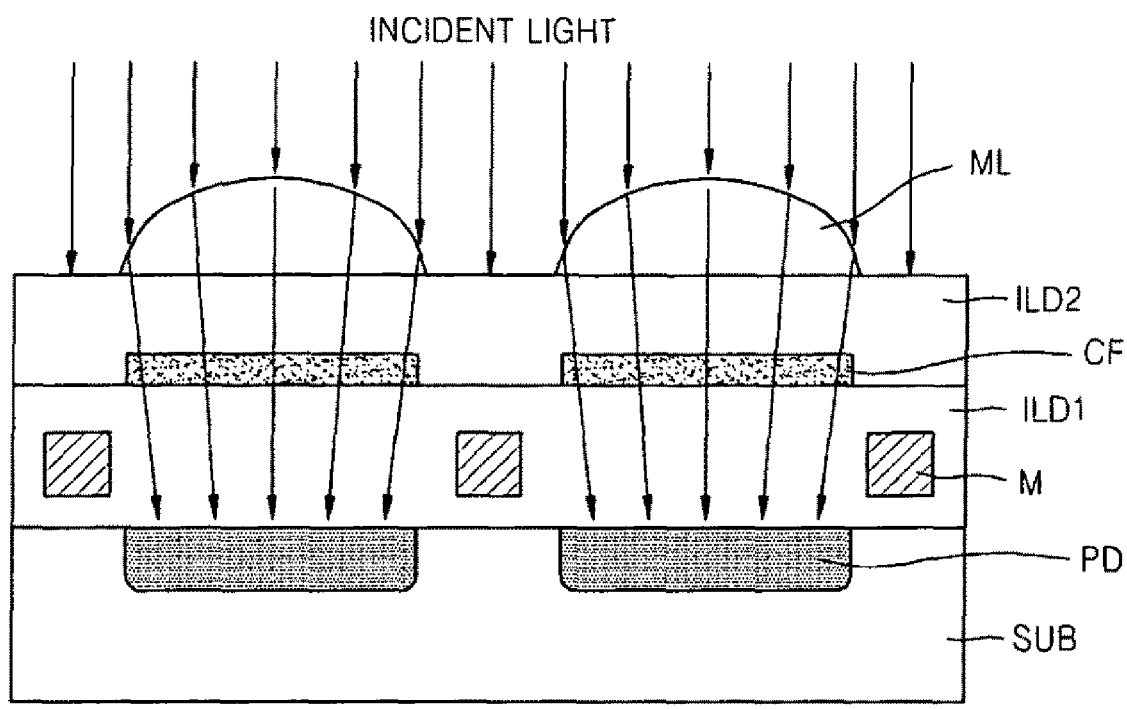
Figure 2A:
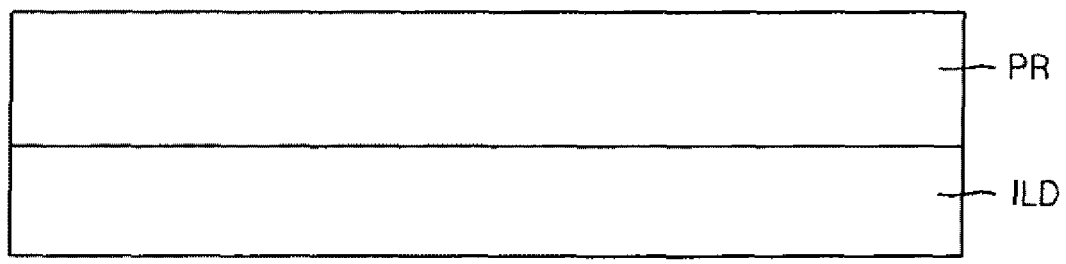
FIGS. 2A through 2C are diagrams illustrating cross-sectional views of a method for forming a conventional microlens.
Figure 2B:
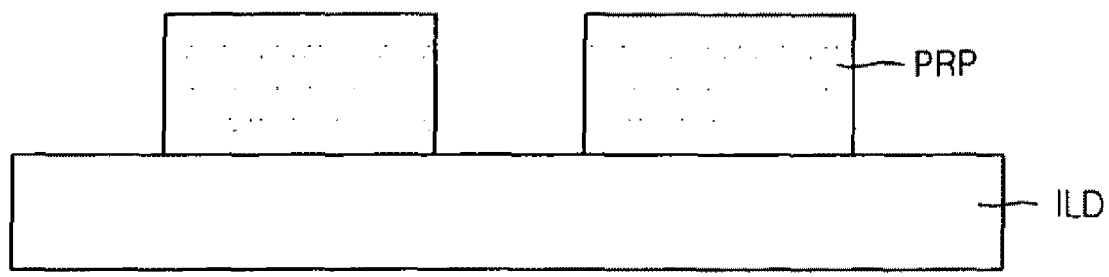
Figure 2C:
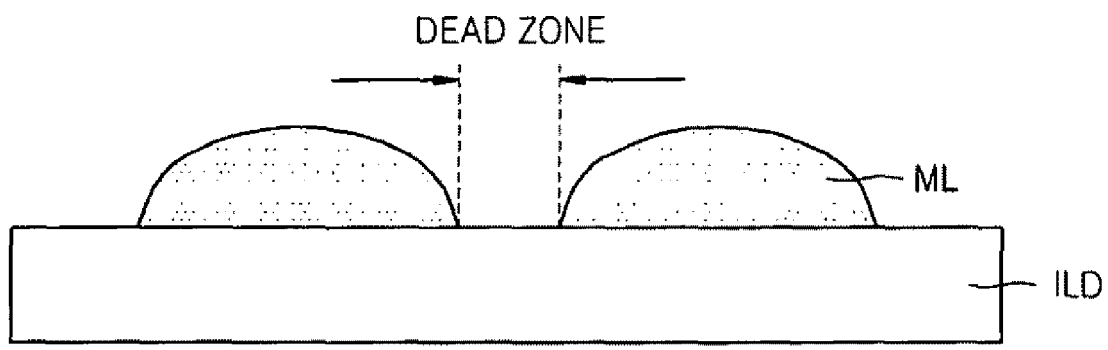

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to an image sensor including a microlens, an image sensor including the microlens, a method of forming the microlens and a method of manufacturing the image sensor. Other example embodiments relate to a method of forming a microlens which increases an optical efficiency, an image sensor including the microlens and a method of manufacturing the image sensor.

FIGS. 5A through 5D are diagrams illustrating cross-sectional views of a method of forming a microlens according to example embodiments.

Figure 5A:
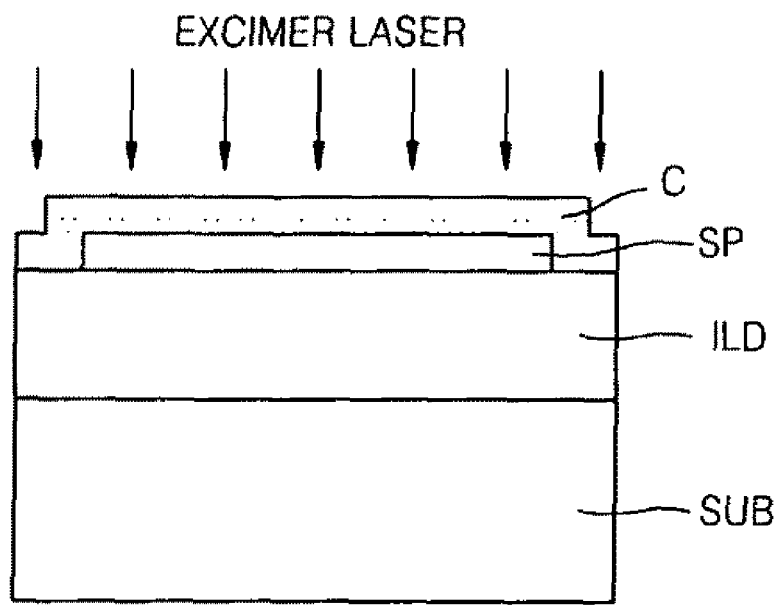
FIGS. 5A through 5D are diagrams illustrating cross-sectional views of a method of forming a microlens according to an example embodiments.

Referring to FIG. 5A, an interlayer dielectric film ILD is formed on a semiconductor substrate SUB and a silicon pattern SP is formed on the interlayer dielectric film ILD. The silicon pattern SP may be formed of amorphous silicon or polysilicon having a width of 10 Å-50,000 Å and/or a thickness of 10 Å-50,000 Å.

A capping film C is formed on the interlayer dielectric film ILD over (or covering) the silicon pattern SP. The capping film C may be a silicon oxide film or zirconium oxide film which exhibits higher transmissivity. The capping film C may be conformally formed on a surface of the silicon pattern SP and the interlayer dielectric film ILD. The silicon pattern SP and the capping film C are annealed. Annealing may include excimer laser annealing (hereinafter referred to as "ELA") performed by an excimer laser. The intensity of the ELA may be 100 mJ/cm$^2$-3000 mJ/cm$^2$.

If the excimer laser is emitted, then the laser penetrates (or proceeds) a lower layer through the capping film C. The lower layer is transparent. As such, the laser concentrates on the silicon pattern SP rather than the interlayer dielectric film ILD of a silicon oxide film. The temperature of the silicon pattern SP rapidly increases. The silicon pattern SP is partially, or completely, melted. The degree of melting may be controlled by the intensity of the excimer laser.

Figure 5B:
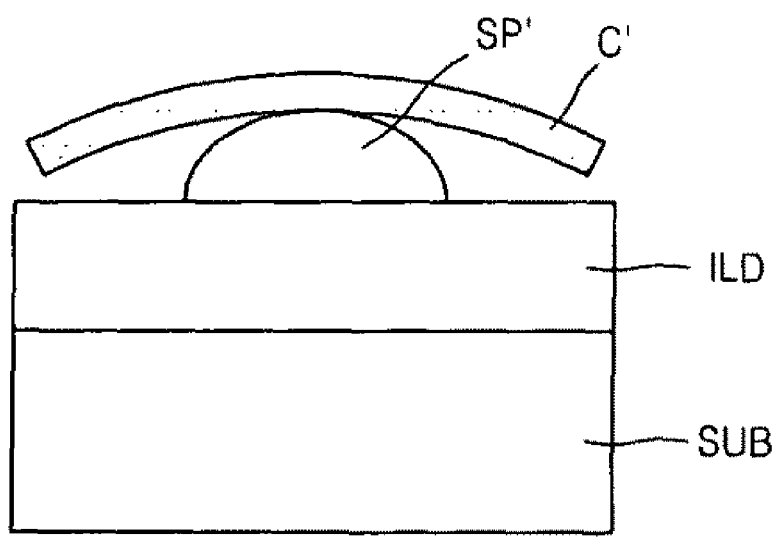

Referring to FIG. 5B, the silicon pattern SP melted by the excimer laser may have a semispherical shape caused by surface tension. As the melted silicon pattern gradually cools down, seeds for crystallization are generated (or formed) in the lower center portion thereof. The seeds are formed in the lower center portion of the melted silicon because the flow of fluid in the lower center portion is smaller than other portions of the melted silicon. The poly-crystallization proceeds (or grows) in the upward direction from the seeds located in the lower center portion. Reference mark SP' indicates a silicon pattern during the process of poly-crystallization.

During poly-crystallization, the capping film C has a certain degree of flexibility such that the shape thereof may be round (e.g., a round roof). As the edge portions (or ends) of the capping film C having a round roof are separated from the interlayer dielectric film ILD, an opening portion is formed (or generated). Reference mark C' indicates the capping film C during the change (or re-shaping) process.

Figure 5C:
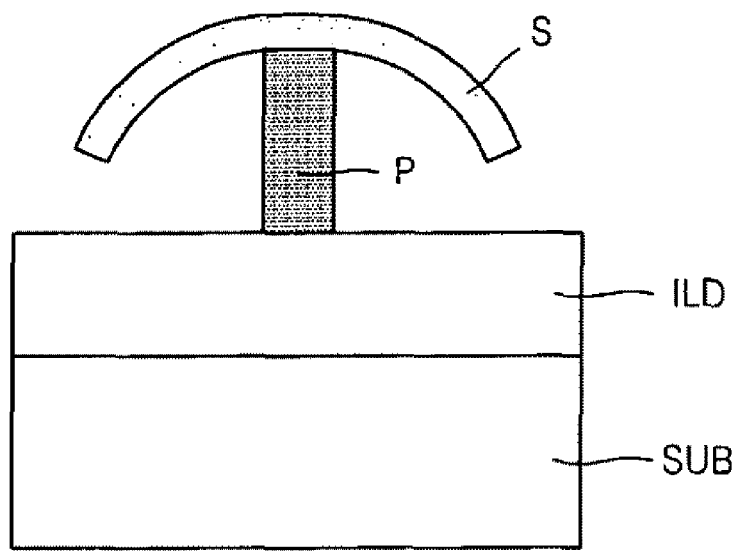

Referring to FIG. 5C, a polysilicon pattern P having a shape of a pole (or cylindrical shape) is formed from the silicon pattern SP through the poly-crystallization by ELA. A shell portion S is formed for a round-type microlens from the capping film C. The polysilicon pattern P and the shell portion S may be formed simultaneously. A width of the polysilicon pattern P is less than a width of the silicon pattern SP and a height of the polysilicon pattern P is greater than a height of the silicon pattern SP. Although not illustrated, part of the capping film C may remain on the interlayer dielectric film ILD.

Figure 5D:
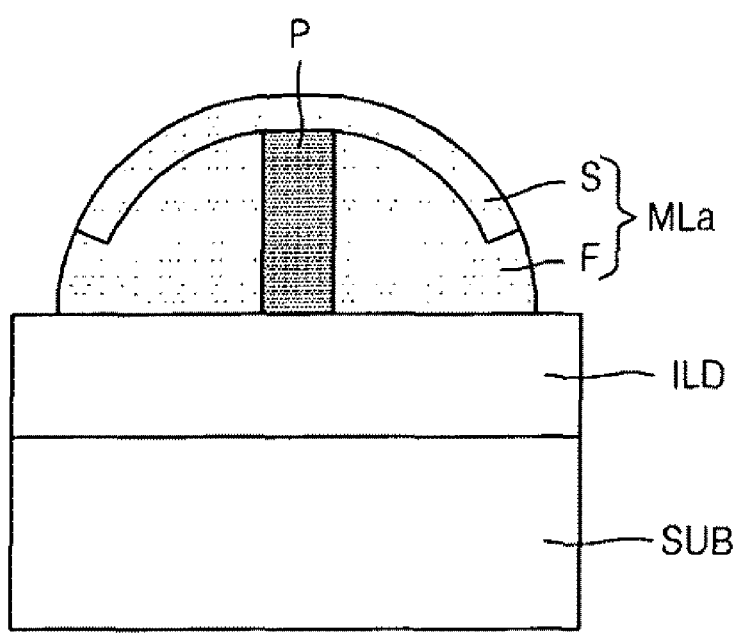

Referring to FIG. 5D, a lens material F fills the interior of the shell portion S (e.g., an area under the shell portion S) through an opening portion between the interlayer dielectric film ILD and the shell portion S. A round-type microlens ML$_a$ is formed from the shell portion S and the lens material F filling the interior of the shell portion S.

The lens material F filling the interior of the shell portion S may be a silicon oxide film or a photoresist film. If the silicon oxide film is formed by LPCVD (low pressure chemical vapor deposition), then the interior of the shell portion S may be filled with the silicon oxide film through the opening. If the photoresist film is used, then the interior of the shell portion S may be filled by the flux of the photoresist film. For example, if the photoresist film is used, then a photoresist film being flux is coated (or formed) with a height greater than the shell portion S, filling the interior of the shell portion S. If the photoresist film outside the shell portion S is removed using the shell portion S as an etching mask, then the photoresist film remains inside the shell portion S.

Figure 6:
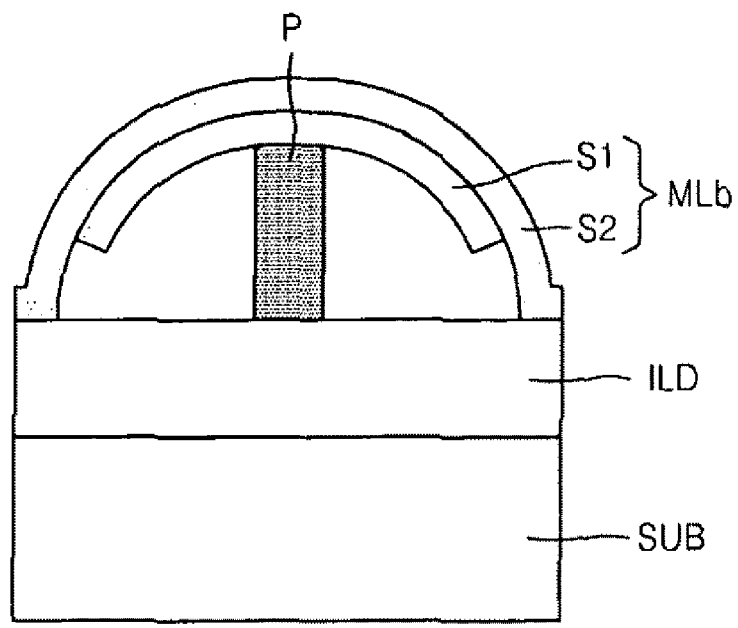

FIG. 6 is a diagram illustrating a cross-sectional view of a method of forming a microlens according to example embodiments. Example embodiments of the method are similar to in the steps shown with reference to FIG. 5A-5C. Thus, for the sake of brevity, the steps subsequent to FIG. 5C will be described below. For the convenience of explanation, the shell portion S of FIG. 5C is referred to as a first shell portion S$_1$ in FIG. 6.

Referring to FIG. 6, a second shell portion S$_2$ for a microlens is formed on the interlayer dielectric film ILD over the first shell portion S$_1$. The second shell portion S$_2$ may be formed of silicon oxide or zirconium oxide. A microlens ML$_b$ is formed having the first and second shell portions S$_1$ and S$_2$. The microlens ML$_b$ is formed having an empty interior.

Figure 7A:
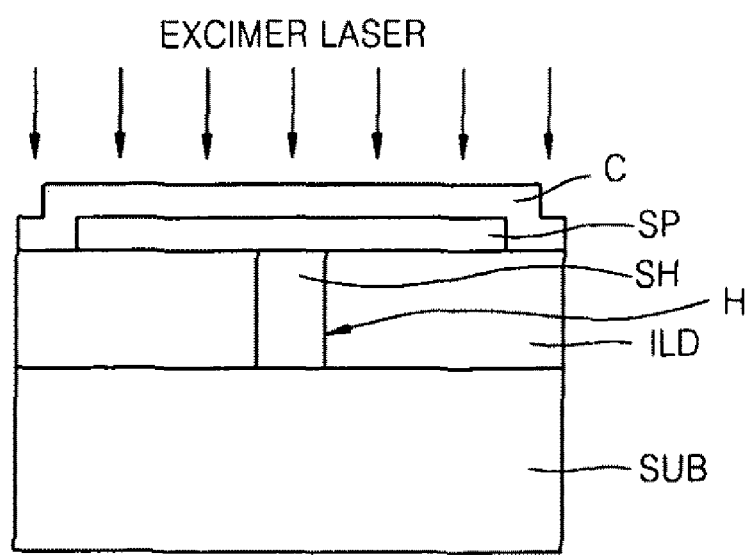
FIGS. 7A through 7C are diagrams illustrating cross-sectional views of a method of forming a microlens according to example embodiments.
Figure 7B:
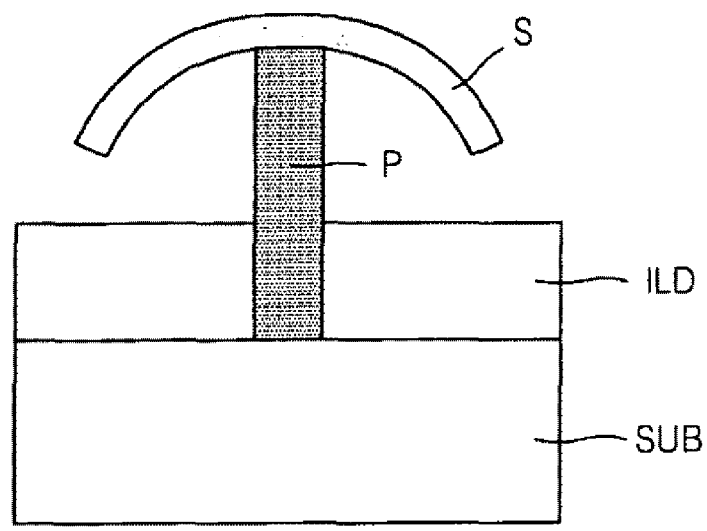
Figure 7C:
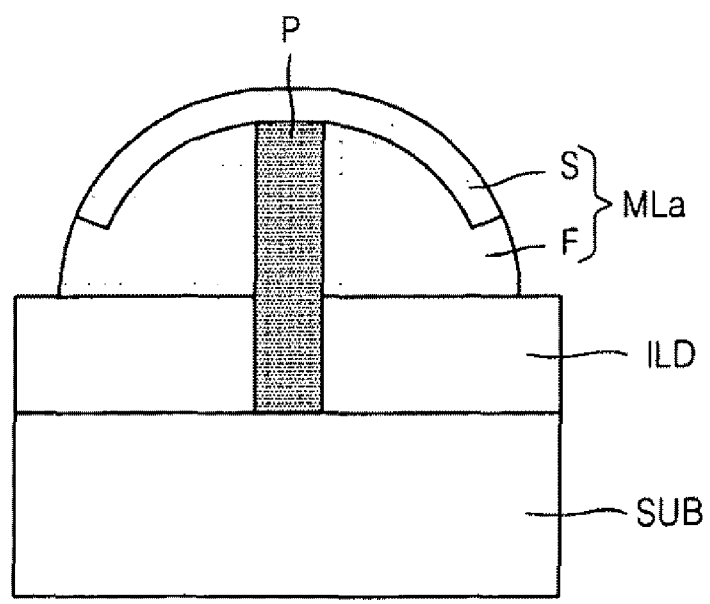

FIGS. 7A through 7C are diagrams illustrating cross-sectional views of a method of forming a microlens according to example embodiments. A description of elements in FIGS. 7A-7C that are similar to elements in FIGS. 5A-5D will be omitted for the sake of brevity.

Referring to FIG. 7A, after an interlayer dielectric film ILD is formed on a semiconductor substrate SUB, a desired portion of the interlayer dielectric film ILD is etched to form a contact hole H. The contact hole H partially exposes the semiconductor substrate SUB. A silicon plug SH is formed in the contact hole H. A silicon pattern SP is formed on the contact hole H. The interlayer dielectric film ILD is formed around the contact hole H. The silicon plug SH may be formed of amorphous silicon or poly silicon. A capping film C is formed on the interlayer dielectric film ILD over the silicon pattern SP.

The silicon pattern SP, the silicon plug SH and the capping film C may be annealed using an excimer laser having an intensity of 100 mJ/cm$^2$-3000 mJ/cm$^2$. If the excimer laser is emitted, then the laser proceeds (or penetrates) into a lower layer through the capping layer C. The temperature of the silicon pattern SP and the silicon plug SH may increase rapidly such that the silicon pattern SP and the silicon plug SH are partially, or completely, melted.

Referring to FIG. 7B, the silicon pattern SP melted by the excimer laser may have a semispherical shape caused by surface tension. As the melted silicon plug SH and silicon pattern SP gradually cool down, seeds for poly-crystallization are generated (or formed) in the boundary portions thereof or the lower portion of the silicon plug SH. Poly-crystallization proceeds (or grows) upward from the seeds. As the melted silicon pattern SP is cooled, the silicon pattern SP is formed with a pole, or cylindrical, shape.

During multi-crystallization, the capping film C has a certain degree of flexibility such that the shape thereof may be round (e.g., a round roof). As the edge portions (or ends) of the capping film C having a round roof are separated from the interlayer dielectric film ILD, an opening portion is formed. A polysilicon pattern P having a cylindrical shape is formed from the silicon plug SH and the silicon pattern SP by the ELA. The shell portion S for a round-type microlens is formed from the capping film C. Referring to FIG. 7C, a lens material F fills the interior of the shell portion S (e.g., an area under the shell portion S) through an opening portion between the interlayer dielectric film ILD and the shell portion S. A round-type microlens ML$_a$ is formed having the shell portion S and the lens material F filling the interior of the shell portion S.

Figure 8:
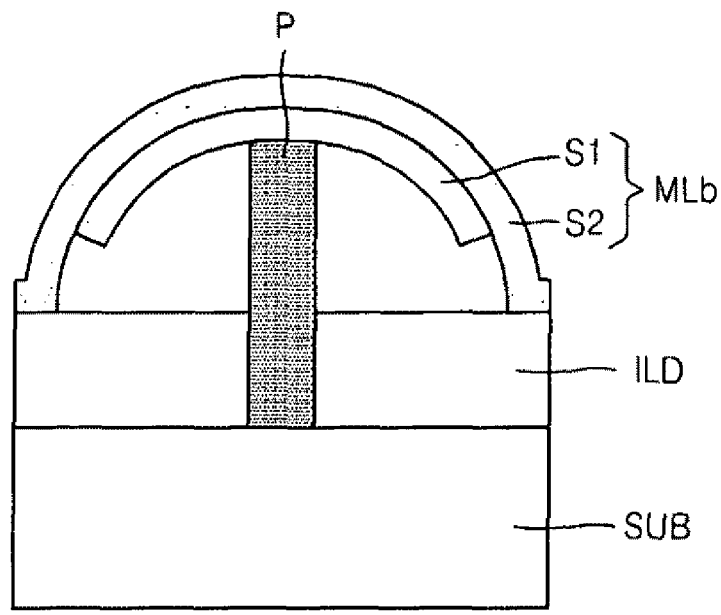

FIG. 8 is a diagram illustrating a cross-sectional view of a method of forming a microlens according to example embodiments. A description of elements in FIG. 8 that are similar to elements in FIGS. 7A-7C will be omitted for the sake of brevity. For the convenience of explanation, the shell portion S of FIG. 7B is referred to as a first shell portion S$_1$ in FIG. 8.

Referring to FIG. 8, a second shell portion S$_2$ for a microlens is formed on the interlayer dielectric film ILD over the first shell portion S$_1$. The second shell portion S$_2$ may be formed of the same material as the second shell portion S$_2$ described with reference to FIG. 6. The microlens ML$_b$ is formed having the first and second shell portions $S_1$ and $S_2$. The microlens $ML_b$ may have an empty interior.

Because the microlens (as described below) is formed by swelling the capping film C using ELA opposed to the conventional photolithography and reflow processes, the dead zone (which is the interval between the microlenses) may be reduced. The dead zone may be more easily reduced when the microlens is formed by adding the second shell portion $S_2$ outside the first shell portion $S_1$.

Example embodiments provide an image sensor including a microlens formed according to the methods described above. In the image sensor according to example embodiments, the polysilicon pattern P described with reference to FIGS. 7A through 7C and FIG. 8 may be used as part of a photodiode.

Figure 9:
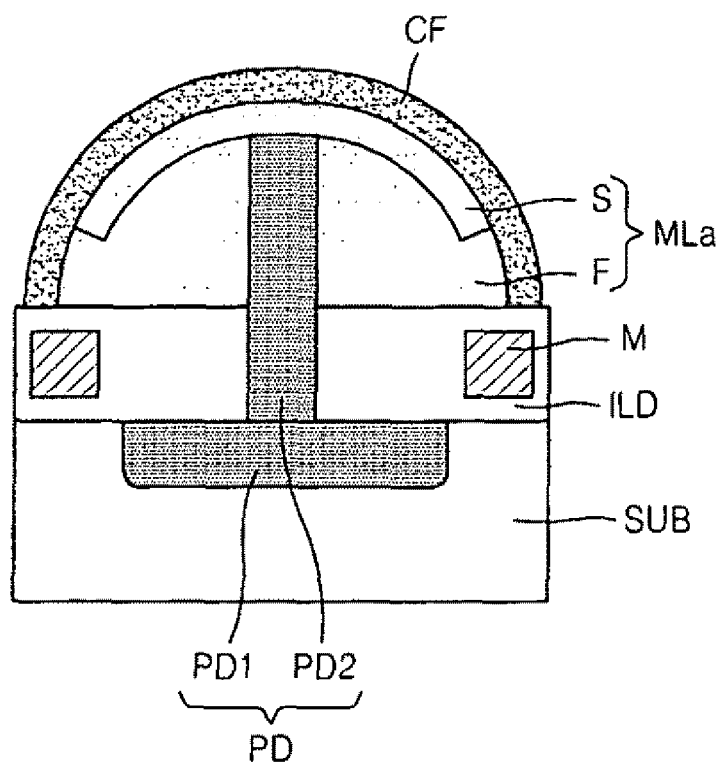
Figure 10:
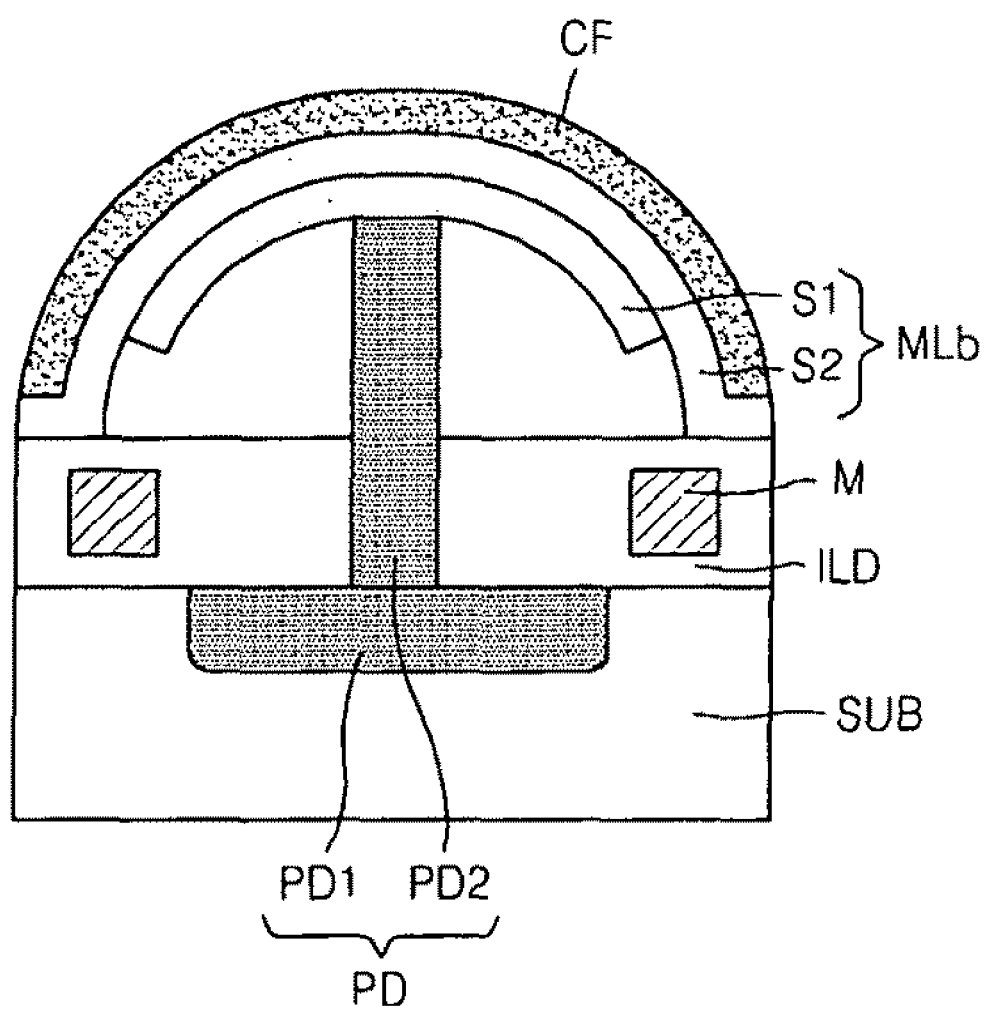

FIG. 9 is a diagram illustrating a partial cross-sectional view of an image sensor according to example embodiments. FIG. 10 is a diagram illustrating a partial cross-sectional view of an image sensor according to example embodiments.

Referring to FIGS. 9 and 10, an image sensor may include a first portion $PD_1$ of a photodiode PD formed by doping impurities in the surface of the semiconductor substrate SUB. The first portion $PD_1$ may be a structure in which a first impurity region and a second impurity region are sequentially formed (or deposited). In other example embodiments, the first portion PD1 may be formed by depositing (or forming) a single impurity region.

The interlayer dielectric film ILD having the contact hole H that partially exposes the first portion $PD_1$ (e.g., a center portion) is formed on the semiconductor substrate SUB. The interlayer dielectric film ILD may be in a multi-layer structure. A metal wiring M, which forms a unit pixel, may be provided in the interlayer dielectric film ILD. The metal wiring M may be positioned such that it does not block incident light. The metal wiring M may be formed in a multi-layer structure.

A second portion $PD_2$ of the photodiode PD is formed in the contact hole H. The second portion $PD_2$ may be formed of doped polysilicon having a height greater than a height of the interlayer dielectric film ILD. The second portion $PD_2$ of the photodiode may be formed of an impurity region.

In other example embodiments, the second portion $PD_2$ may be in a structure in which the first impurity region and the second impurity region are sequentially formed (or deposited). The second portion $PD_2$ and the first portion $PD_1$ function as a photodiode.

In FIGS. 9 and 10, respectively, the round-type microlenses $ML_a$ and $ML_b$ are formed on the interlayer dielectric film ILD over the second portion $PD_2$. A color filter layer CF is formed on a surface of the microlenses $ML_a$ and $ML_b$. The microlenses $ML_a$ and $ML_b$ may be divided into a shell portion and/or an interior portion (e.g., an area under the shell portion). The interior may be filled with a lens material as described in reference to FIGS. 5 and 7. In other example embodiments, the interior may be empty as described with reference to FIG. 6.

A first-type microlens, as shown in FIG. 9, may be formed of the round-type shell portion S and a filler material F. The round-type shell portion S may be formed on an upper surface of the second portion $PD_2$ of the photodiode. The round-type shell portion S may be separated from the interlayer dielectric film ILD. The edge (or end) of the round-type shell portion S may be separated form the interlayer dielectric film ILD. The filler material F that fills the interior of the shell portion S. The shell portion S of the first-type microlens $ML_a$ may be formed of silicon oxide or zirconium oxide. The filing F may be formed of silicon oxide or photoresist.

A second-type microlens, as shown in FIG. 10, may include the round-type first shell portion $S_1$ and the second shell portion $S_2$. The round-type first shell portion $S_1$ is formed on the upper surface of the second portion $PD_2$ of the photodiode. The round-type first shell portion $S_1$ is separated from the interlayer dielectric film ILD. The second shell portion $S_2$ is formed on the first shell portion $S_1$ and contacts the interlayer dielectric film ILD. The first and second shell portions $S_1$ and $S_2$ of the second-type microlens $ML_b$ may be formed of silicon oxide or zirconium oxide.

Because the first-type and second-type microlens are formed according to the method described above opposed to the conventional photolithography and reflow processes, the dead zone between the microlenses may be reduced. Because the second-type is a structure in which the second shell portion $S_2$ is formed outside of the first shell portion $S_1$, the dead zone may be more easily reduced.

Because the photodiode PD includes the first portion $PD_1$ in the semiconductor substrate SUB and the second portion $PD_2$ having a pole (or cylindrical) shape near the center of the photodiode $PD_1$, the concentration of the photodiode PD increases. If the incident light is inclined, then malfunction of the image sensor due to the loss of light may be prevented because the second portion $PD_2$ decreases loss of light.

The image sensor according to example embodiments may further include a second microlens formed on the color filter layer CF with a dielectric film interposed therebetween. The color filter layer CF may be formed on the microclines $ML_a$ or $ML_b$ with another interlayer dielectric film interposed between the color filter layer CF and the microlens $ML_a$ or $ML_b$.

Figure 11:
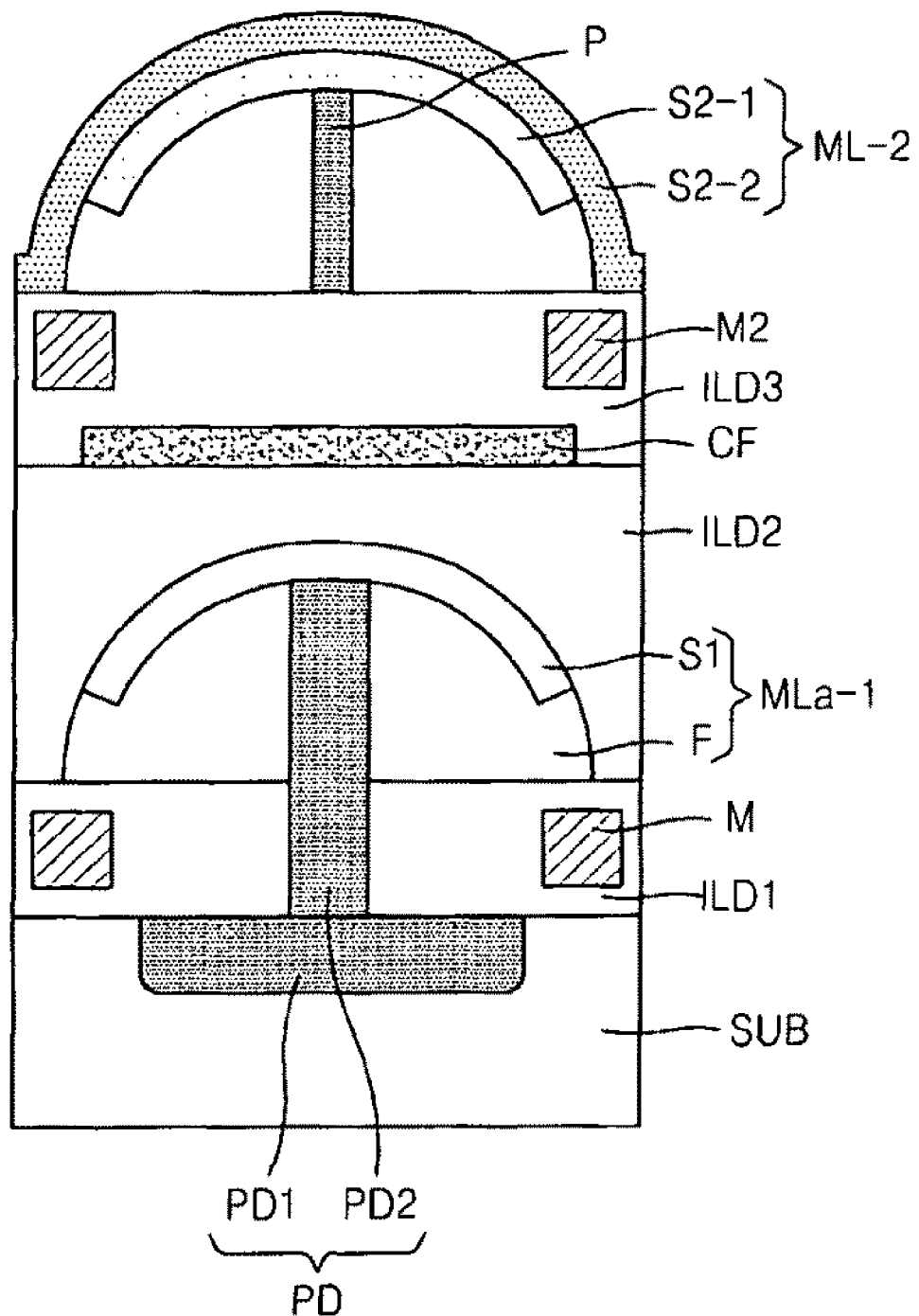

FIG. 11 is a diagram illustrating a partial cross-sectional view of an image sensor according to example embodiments. For the convenience of explanation, the microlens $ML_a$ of FIG. 9 is referred to as a first microlens $ML_{a-1}$ in FIG. 11; the interlayer dielectric film ILD of FIG. 9 is referred to as a first interlayer dielectric film $ILD_1$ in FIG. 11, and the metal wiring M of FIG. 9 is referred to as a first metal wiring $M_1$ in FIG. 11.

Referring to FIG. 11, a color filter layer CF is formed on the first microlens $ML_{a-1}$ with the second interlayer dielectric film $ILD_2$ interposed therebetween. A third interlayer dielectric film $ILD_3$ is formed on the color filter layer CF. A second metal wiring $M_2$ having a similar shape as the first metal wiring $M_1$ may be provided in the third interlayer dielectric film $ILD_3$.

A polysilicon pattern $P_2$ having a pole (or cylindrical) shape is formed on the third interlayer dielectric film $ILD_3$ over an area where the second portion $PD_2$ is formed. The second microlens $ML_{b-2}$ is formed on the interlayer dielectric film $ILD_3$ over the polysilicon pattern P.

As shown in FIG. 11, the second microlens $ML_{b-2}$ is formed on an upper surface of the polysilicon pattern $P_2$ and enclosing the same. The second microlens $ML_{b-2}$ may include a first shell portion $S_{2-1}$ and a second shell portion $S_{2-2}$. The first shell portion $S_{2-1}$ for a round-type second microlens is separated from the third interlayer dielectric $ILD_3$. In other example embodiments, an edge (or end) of the first shell portion $S_{2-1}$ may be separated from the third interlayer dielectric $ILD_3$. The second shell portion $S_{2-2}$ for the second microlens may be formed on the second shell portion $S_{2-1}$ and the interlayer dielectric film $ILD_3$.

Although the microlens $ML_{b-2}$ is shown in FIG. 11 is empty (in other words, the second-type microlens), the microlens $ML_{b-2}$ may be formed having the same structure and of the same material as the microlens $ML_a$ described with reference to FIG. 9 or the microlens $ML_b$ described with reference to FIG. 10.

If the image sensor has a dual microlens, as shown in FIG. 11, then the width of the upper microlens is greater than the width of the lower microlens. Also, the lower microlens may be a first-type microlens and the upper microlens may be formed a second-type microlens.

Hereinafter, a method of manufacturing an image sensor according to example embodiments will be described.

FIGS. 12A through 12G are diagrams illustrating cross-sectional views of a method of manufacturing an image sensor according to example embodiments.

Figure 12A:
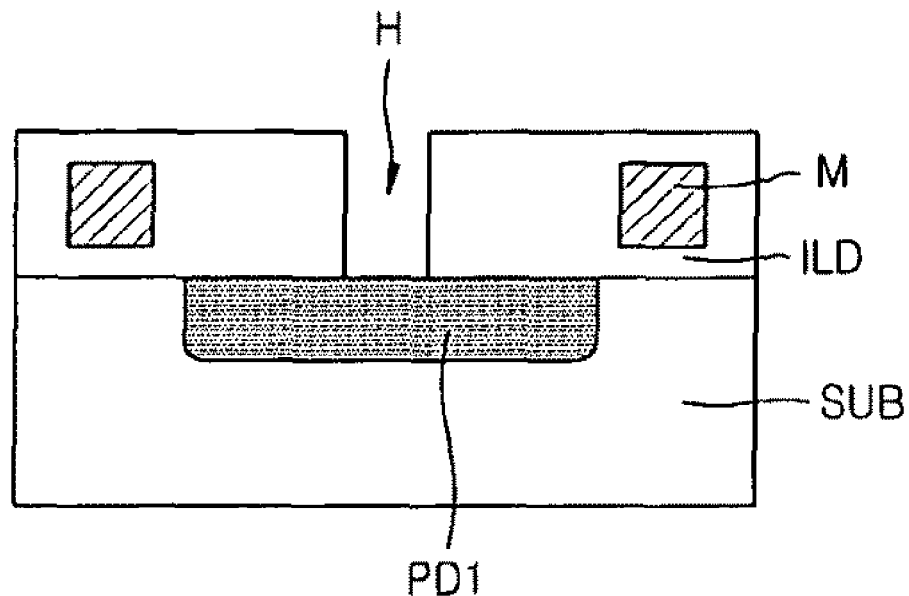
FIGS. 12A through 12G are diagrams illustrating cross-sectional views of a method of manufacturing an image sensor according to example embodiments.

Referring to FIG. 12A, a first portion $PD_1$ of a photodiode PD is formed by doping impurities in a surface of a semiconductor substrate SUB. An interlayer dielectric film ILD having a contact hole H partially exposing the first portion $PD_1$ of the photodiode PD is formed on the semiconductor substrate SUB. The interlayer dielectric film ILD may be in a multi-layer structure. A metal wiring M forming a unit pixel may be provided in the interlayer dielectric film ILD. The metal wiring M may be in a multi-layer structure.

Figure 12B:
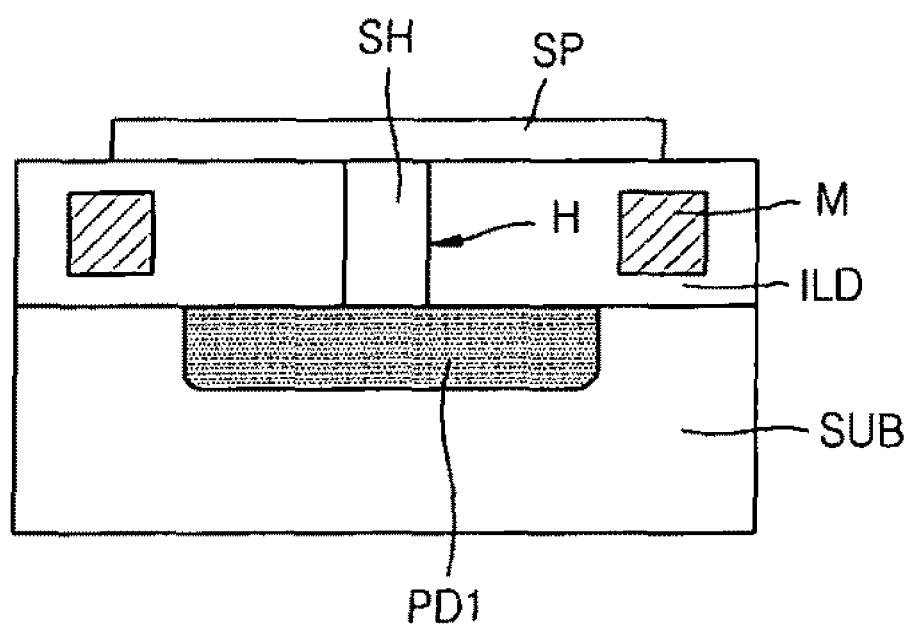

Referring to FIG. 12B, if a silicon plug SH is formed in the contact hole H, then a silicon pattern SP is formed on the contact hole H and the interlayer dielectric film ILD. The silicon pattern SP may have a first height and a width greater than the contact hole H. The silicon plug SH and silicon pattern SP may be formed simultaneously or sequentially. The silicon plug SH and silicon pattern SP may be formed of amorphous silicon or polysilicon. The silicon pattern SP may be formed in a variety of shapes (e.g., a circle, rectangle, etc.). The silicon pattern SP may have a width of 10 Å-50000 Å and/or a thickness of 10 Å-50000 Å. The silicon plug SH and silicon pattern SP may be doped with impurities. If impurities are not doped in the silicon pattern SP during the formation of the silicon pattern SP, then the silicon pattern SP is doped with impurities in the subsequent step in order for the silicon pattern SP to function as photodiode.

Figure 12C:
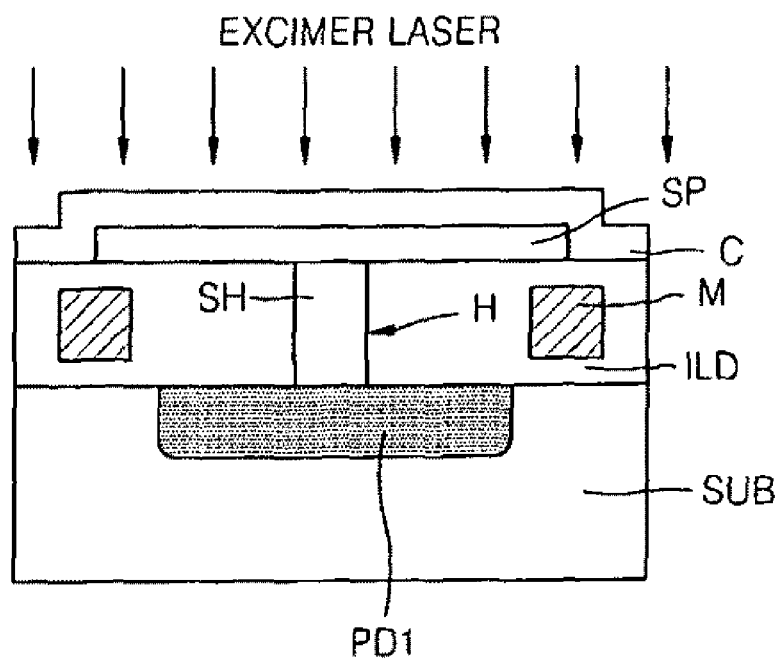

Referring to FIG. 12C, the capping film C is formed on the interlayer dielectric film ILD over the silicon pattern SP. The capping film C may be a film exhibiting a higher transmissivity (e.g., a silicon oxide film or a zirconium film). The capping film C may be formed to a uniform thickness. The silicon pattern SP, silicon plug SH and capping film C are annealed (e.g., excimer laser annealing (ELA)). The annealing may be performed at an intensity of 100 mJ/cm$^2$-3000 mJ/cm$^2$.

As described above, if the excimer laser is emitted, then the laser proceeds (or penetrates) into the lower layer through the capping layer C. The laser is concentrated on a portion of the silicon pattern SP and the silicon plug SH rather than the interlayer dielectric film ILD of a silicon oxide film. The temperature of the silicon pattern SP and the silicon plug SH increases rapidly such that the silicon pattern SP and the silicon plug SH are partially, or completely, melted. The degree of melting may be controlled according to the intensity of the excimer laser.

Figure 12D:
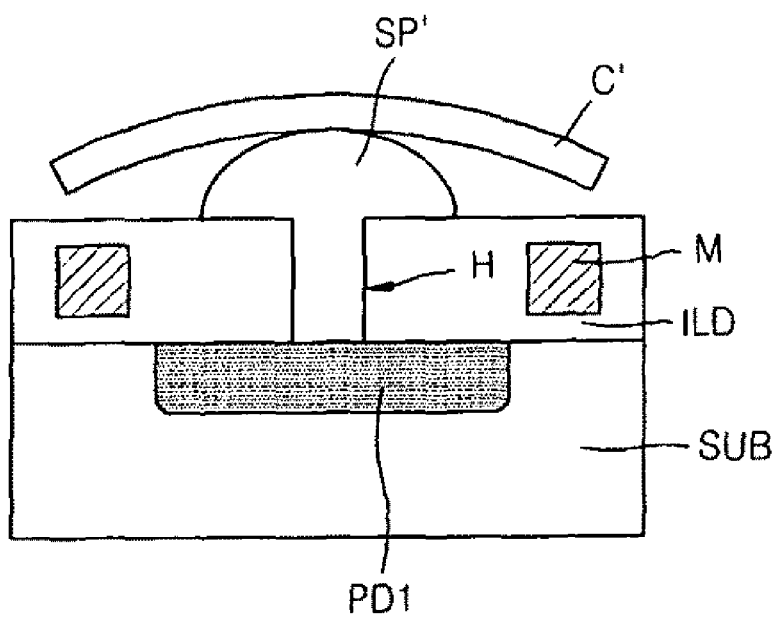

Referring to FIG. 12D, the silicon pattern SP melted by the excimer laser tends to have a semispherical shape caused by surface tension. As the melted silicon pattern SP and silicon plug SH gradually cool down, seeds for poly-crystallization are generated (or formed) in the lower center portion thereof. The seeds are generated (or formed) in the lower center of the melted silicon because the flow of fluid in the lower center of the melted silicon is smaller than other areas of the melted silicon. Poly-crystallization proceeds (or grows) in the upward direction from the seeds in the lower center. Reference mark SP' indicates the silicon pattern and silicon plug during poly-crystallization.

During poly-crystallization, a capping film C formed on the silicon pattern SP has a certain degree of flexibility such that the shape thereof is round (e.g., a round roof). The capping film C having a round roof may not contact the interlayer dielectric film ILD. The edge (or end) of the capping film C may not contact the interlayer dielectric film ILD. Reference mark C' indicates the capping film during poly-crystallization.

Figure 12E:
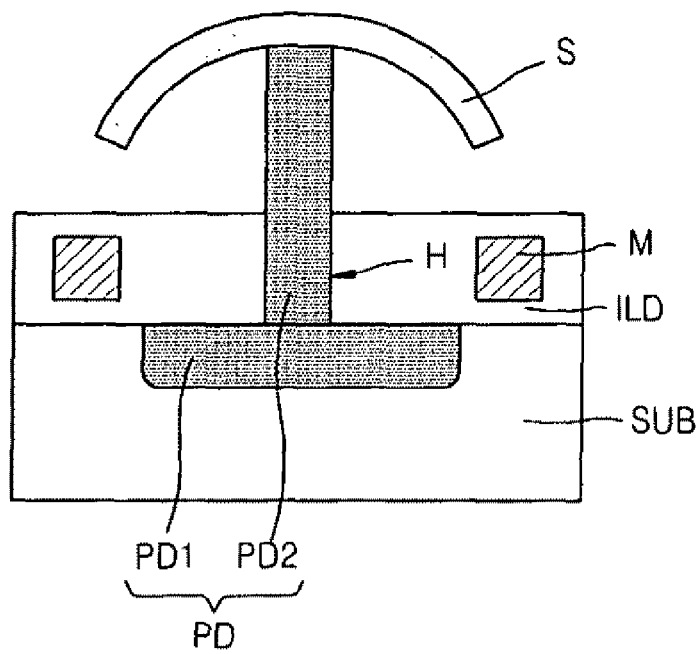

Referring to FIG. 12E, the polysilicon pattern having the cylindrical shape is formed from the silicon plug SH and silicon pattern SP during poly-crystallization by ELA. A shell portion S for the round-type microlens is simultaneously formed from the capping film. The polysilicon pattern has a height greater than a height of the silicon pattern SP. The polysilicon pattern may be the second portion $PD_2$ of photodiode PD. If the silicon pattern SP is an undoped material, then the doping process may be performed in the polysilicon pattern after poly-crystallization.

Figure 12F:
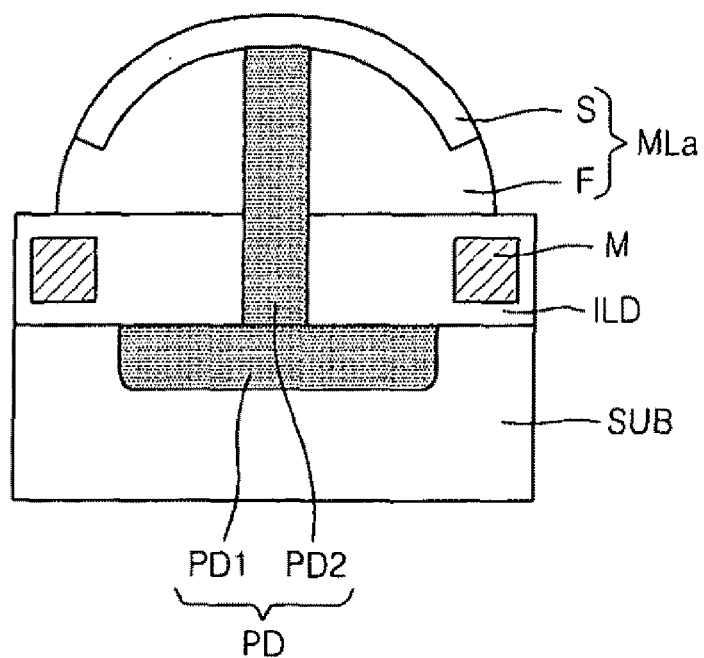

Referring to FIG. 12F, a lens material F is filled in an interior of the shell portion S (e.g., an area under the shell portion S) through an opening between the interlayer dielectric film ILD and the shell portion S. The lens material F may be formed of silicon oxide film or photoresist film.

As described above, if the silicon oxide film is formed by LPCVD, then the interior of the shell portion S may be filled through the opening. If the photoresist film is used, then the interior of the shell portion S may be filled by the flux of the photoresist film. A microlens $ML_a$ is formed that includes the shell portion S and the lens material F filling the interior of the shell portion S.

Figure 12G:
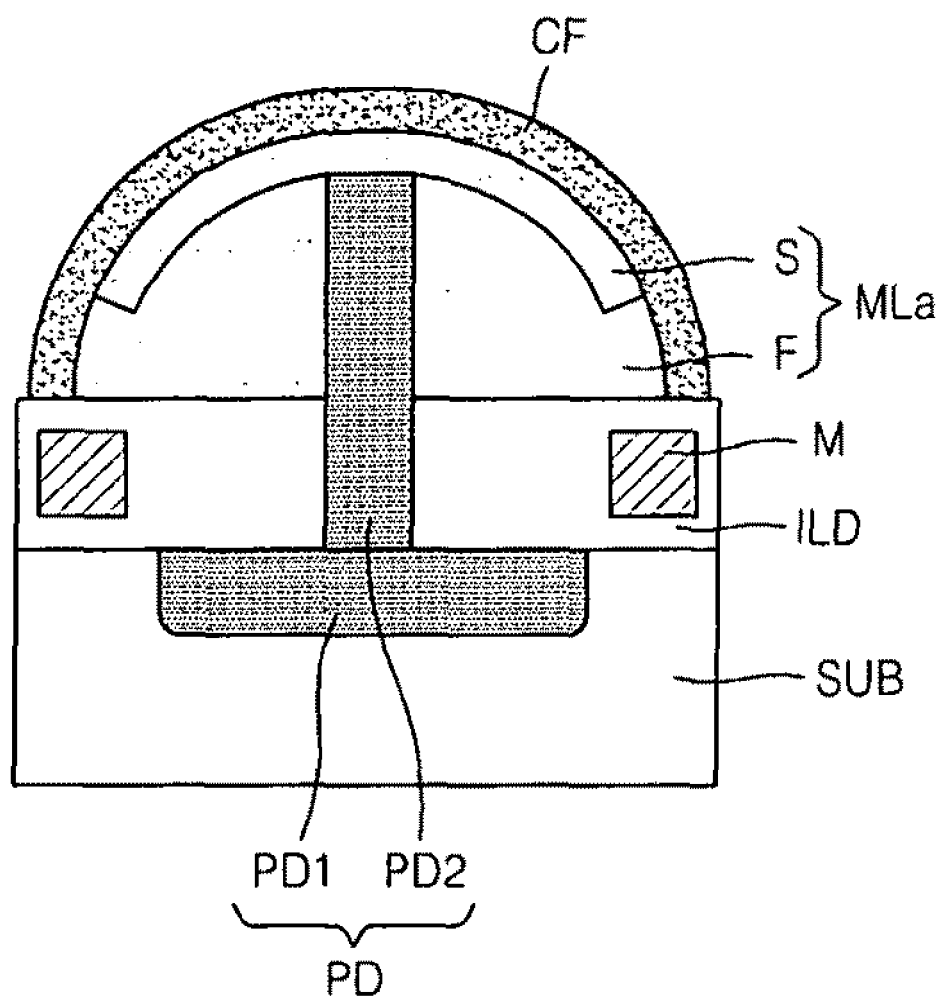

Referring to FIG. 12G, a color filter layer CF is formed on a surface of the microlens $ML_a$.

Figure 13:
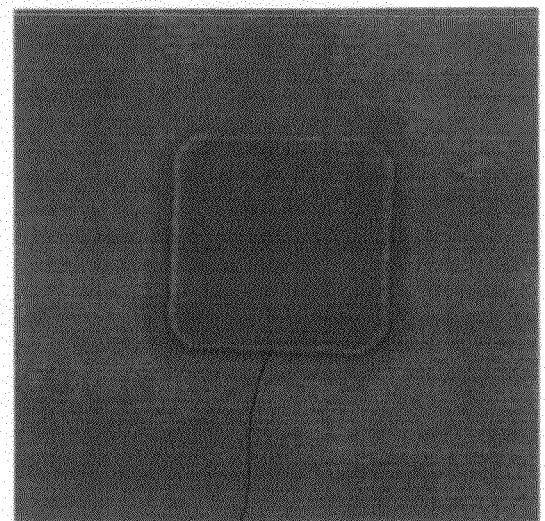
Figure 14:
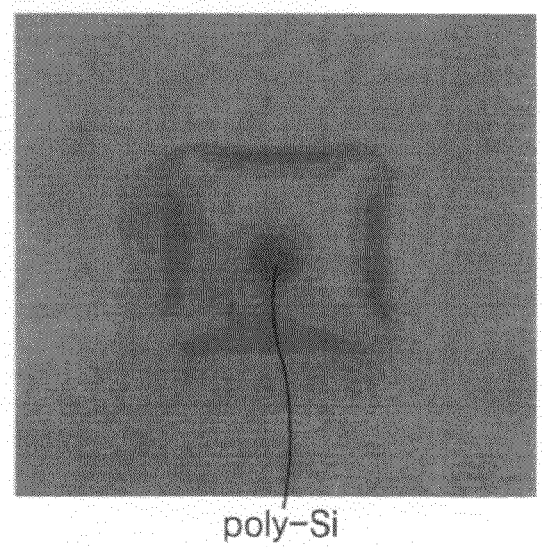
Figure 15:
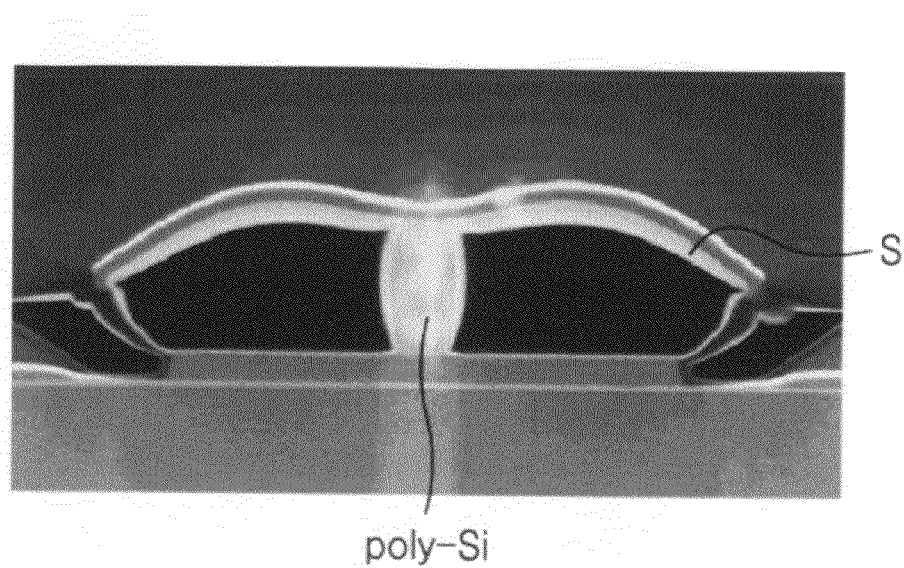

FIG. 13 is a diagram illustrating a plan view image of an amorphous silicon pattern (a-Si) before excimer laser annealing (ELA) is performed. FIG. 14 is a diagram illustrating a plan view image of a polysilicon pattern (a-Si) formed by ELA the amorphous silicon pattern of FIG. 13 at an intensity of 950 mJ/cm$^2$. FIG. 15 is a diagram illustrating a cross-sectional view of the shell portion S for a round-type microlens and the polysilicon pattern (poly-Si) having a cylindrical shape formed according to example embodiments.

Figure 16A:
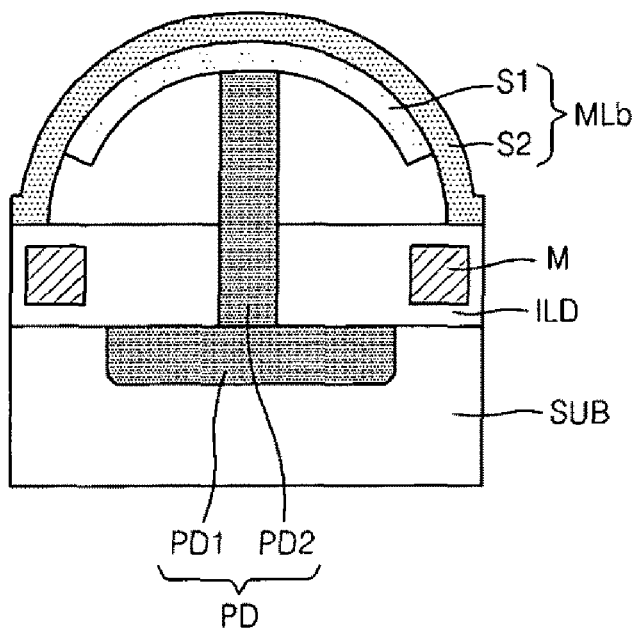
FIGS. 16A and 16B are diagrams illustrating cross-sectional views of a method of manufacturing an image sensor according to example embodiments.
Figure 16B:
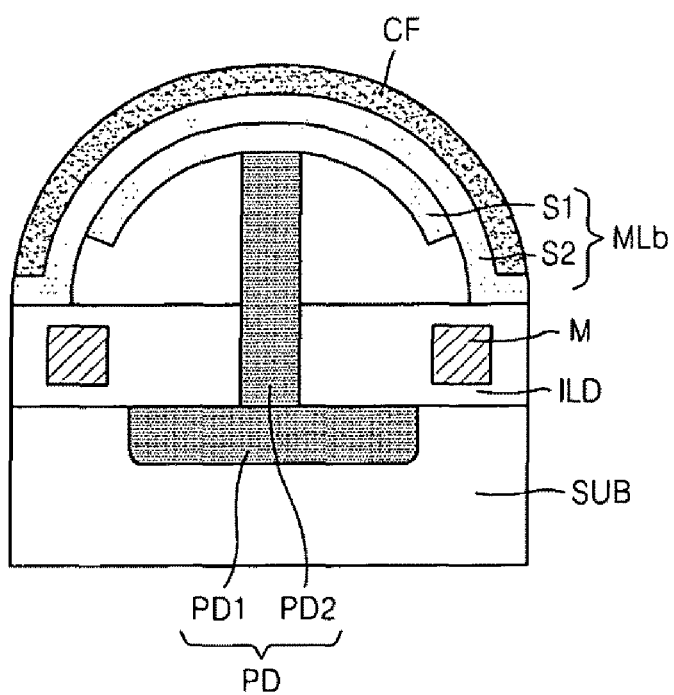

FIGS. 16A and 16B are diagrams illustrating cross-sectional views a method of manufacturing an image sensor according to example embodiments. A description of elements in FIGS. 16A and 16B that are similar to elements in FIGS. 12A-12G will be omitted for the sake or brevity. For the convenience of explanation, the shell portion S of FIG. 12E is referred to as the first shell portion $S_1$ in FIGS. 16A and 16B.

Referring to FIG. 16A, a second shell portion $S_2$ for a microlens $ML_b$ is formed on the first shell portion $S_1$ and the interlayer dielectric film ILD. The second shell portion $S_2$ may be formed of silicon oxide or zirconium oxide. The microlens $ML_b$ is formed having the first and second shell portions $S_1$ and $S_2$.

Referring to FIG. 16B, a color filter layer CF is formed on a surface of the second shell portion $S_2$.

Figure 17A:
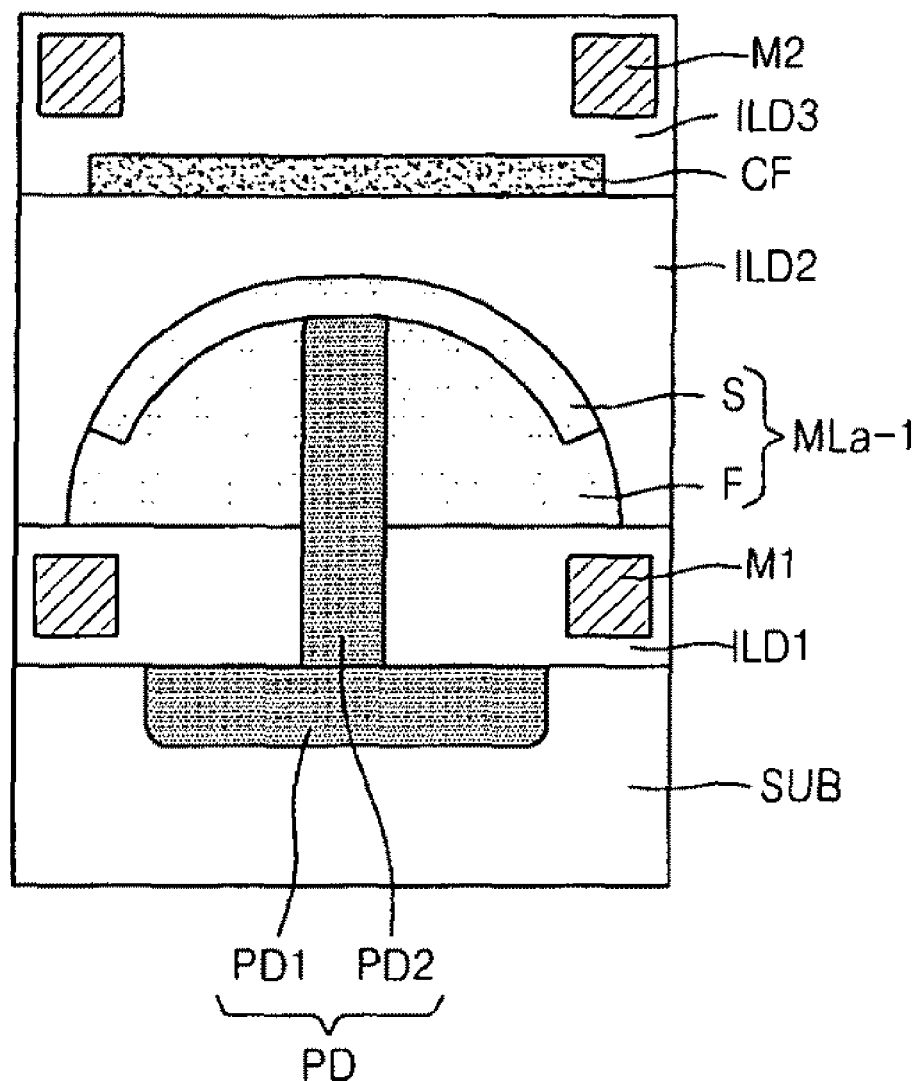
FIGS. 17A and 17D are diagrams illustrating cross-sectional views of a method of manufacturing an image sensor according to example embodiments.
Figure 17B:
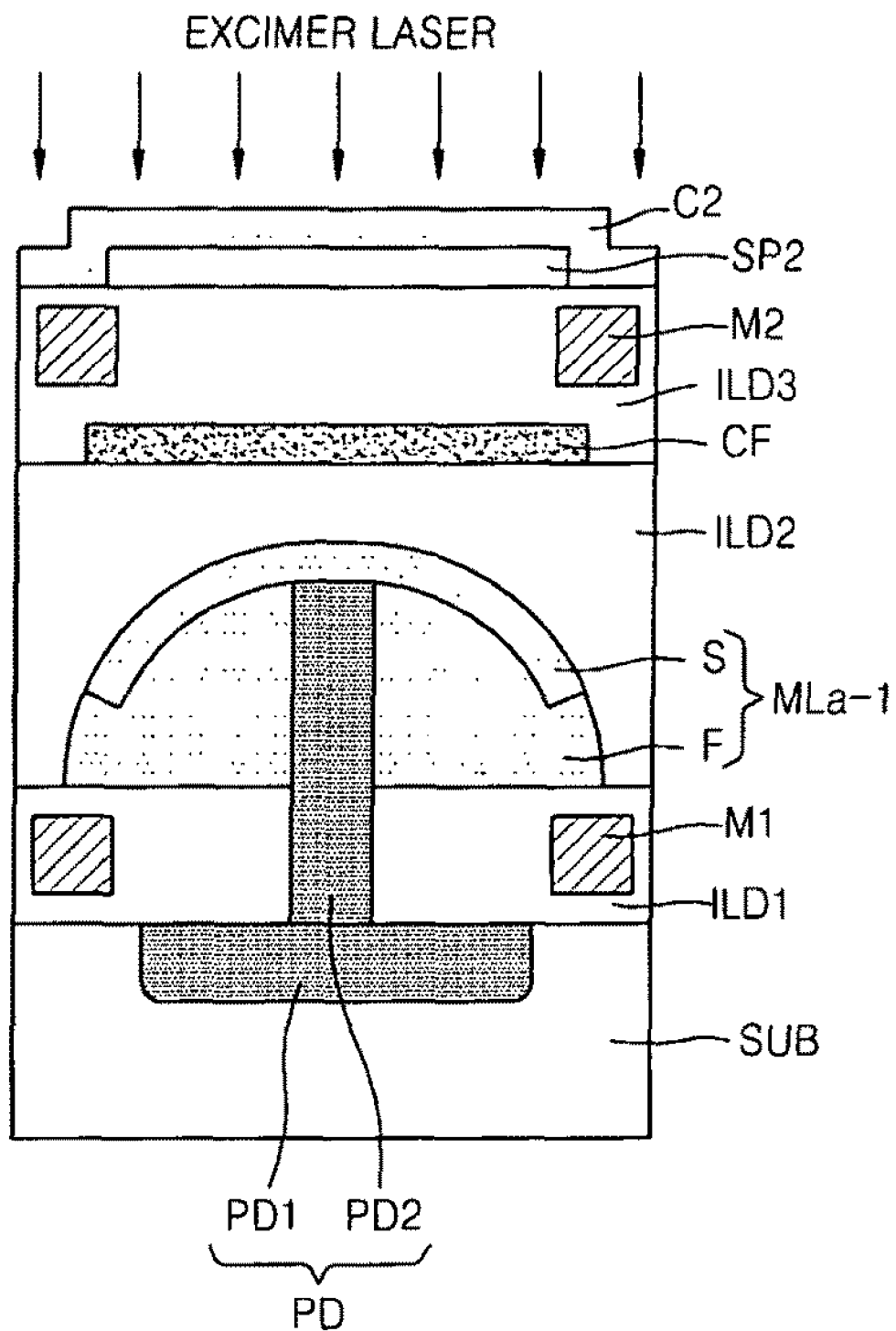
Figure 17C:
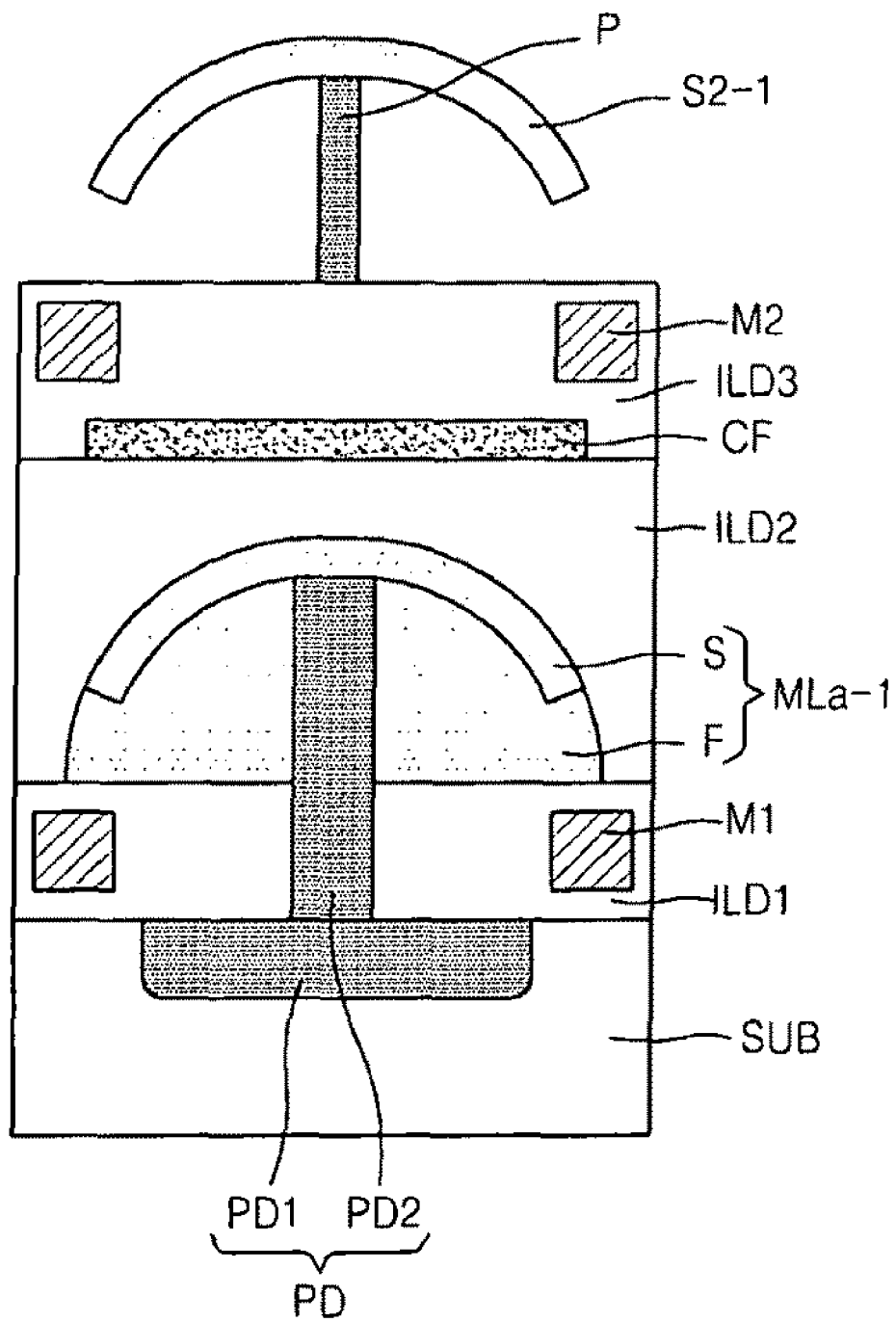
Figure 17D:
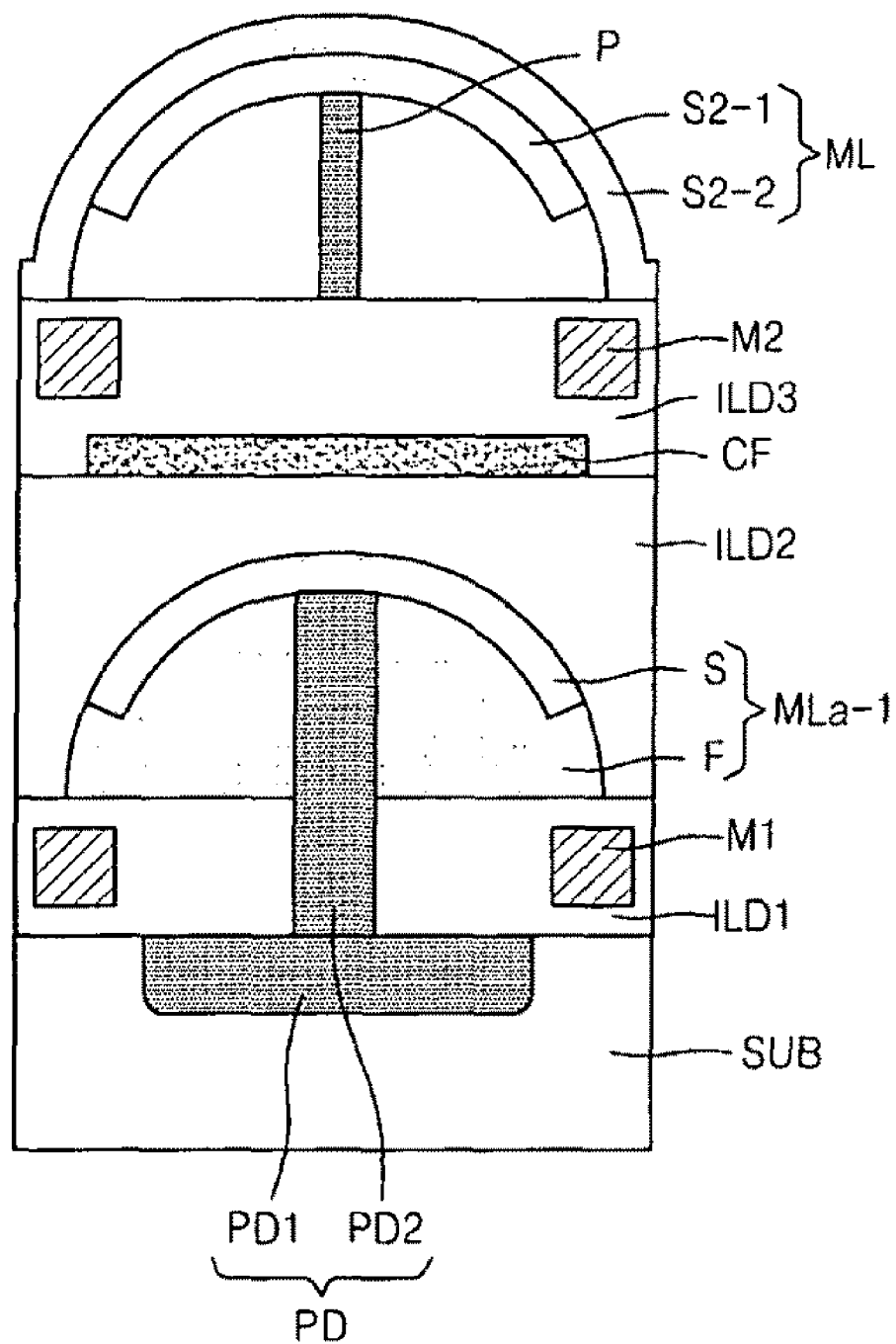

FIGS. 17A and 17D are diagrams illustrating cross-sectional views of a method of manufacturing an image sensor according to example embodiments. A description of elements in FIGS. 17A-17D that are similar to elements in FIGS. 12A-12G will be omitted for the sake or brevity. For the convenience of explanation, the microlens $ML_a$ of FIG. 12F is referred to as the first microlens $ML_{a-1}$ in FIGS. 17A through 17D, the shell portion S of FIG. 12F is referred to as the first shell portion $S_1$ in FIGS. 17A through 17D, the interlayer dielectric film ILD of FIG. 12F is referred to as the first interlayer dielectric film $ILD_1$ in FIGS. 17A through 17D and the metal wiring M of FIG. 12F is referred to as the first metal wiring $M_1$ in FIGS. 17A through 17D.

Referring to FIG. 17A, a second interlayer dielectric film $ILD_2$ is formed on the first interlayer dielectric film $ILD_1$ over the microlens $ML_{a-1}$. A surface of the second interlayer dielectric film $ILD_2$ is planarized. The color filter layer CF is formed on a portion of the second interlayer dielectric film $ILD_2$ over the microlens $ML_{a-1}$. A third interlayer dielectric film $ILD_3$ is formed over the color filter layer CF. A second metal wiring $M_2$ may be formed in the third interlayer dielectric film $ILD_3$. The second metal wiring $M_2$ is arranged such that the wiring does not block the incident light, contrary to the first metal wiring $M_1$. The third interlayer dielectric film $ILD_3$ and second metal wiring $M_2$ may be in a multi-layer structure.

Referring to FIG. 17B, a second silicon pattern $SP_2$ on formed in a portion of the third interlayer dielectric film $ILD_3$. The second silicon pattern $SP_2$ is formed over the silicon pattern SP. A second capping film $C_2$ is formed on the third interlayer dielectric film $ILD_3$ over the second silicon pattern $SP_2$. The material, width and/or thickness of the second silicon pattern $SP_2$ and second capping film $C_2$ may be the same as the silicon pattern SP and/or capping film C. By emitting an excimer laser to the semiconductor substrate SUB residual, poly-crystallization of the second silicon pattern $SP_2$ may be performed using the same method as described above. The shape of the second capping film $C_2$ is altered (or changed).

Referring to FIG. 17C, a second polysilicon pattern $P_2$ having a cylindrical shape is formed from the second silicon pattern $SP_2$ through poly-crystallization by ELA. In example embodiments, a first shell portion $S_{2-1}$ of the round-type second microlens is formed from the second capping film $C_2$ simultaneously with the formation of the second polysilicon pattern $SP_2$.

Referring to FIG. 17D, a second shell portion $S_{2-2}$ for the second microlens is formed on the first shell portion $S_{2-1}$ for the second microlens and the interlayer dielectric film $ILD_3$. A second microlens $ML_{b-2}$ of the second-type is formed having two shell portions and an empty interior.

Although the second microlens described with reference to FIGS. 17A-17D is a second-type microlens, in other example embodiments the second microlens may be a first-type microlens, in which the interior of the second microlens is filled. The image sensor having a dual microlens may be manufactured by the same method as the example embodiments described-above. In other example embodiments, the first microlens in the lower portion may be of the second-type while the second microlens in the upper portion may be a first-type or a second-type microlens.

According to example embodiments, the image sensor having a new structure is manufactured based on the principle that if a transparent capping film is formed over a silicon pattern, which is subsequently poly-crystallized by ELA, then the silicon pattern becomes a polysilicon pattern having a cylindrical shape and the capping film becomes a shell portion for a round-type microlens.

Because the fundamental structure of the microlens is formed by swelling the capping film opposed to using the conventional photolithography and reflow processes, the dead zone (which is the interval between the microlenses) may be reduced. The dead zone may also decrease if the microlens is formed by adding the second shell portion to the first shell portion formed from the capping film.

According to other example embodiments, if the incident light is inclined, then the light loss is prevented by the photodiode because the second portion $PD_2$ of photodiode (which has a pole, or cylindrical, shape) is formed under the center portion of the microlens.

As such, example embodiments may increase the optical efficiency of the image sensor and/or prevent (or decrease the likelihood of) malfunction of the sensor due to the light loss. Example embodiments may also increase the efficiency of a lens because the material used for the lens material (e.g., a silicon oxide film) has a higher refractive index than the conventional photoresist film. Because the ELA process that concentrates a laser on the amorphous silicon pattern is used, a higher temperature process is not needed, reducing costs associated with higher temperature processes and/or property deterioration.

Figure 18:
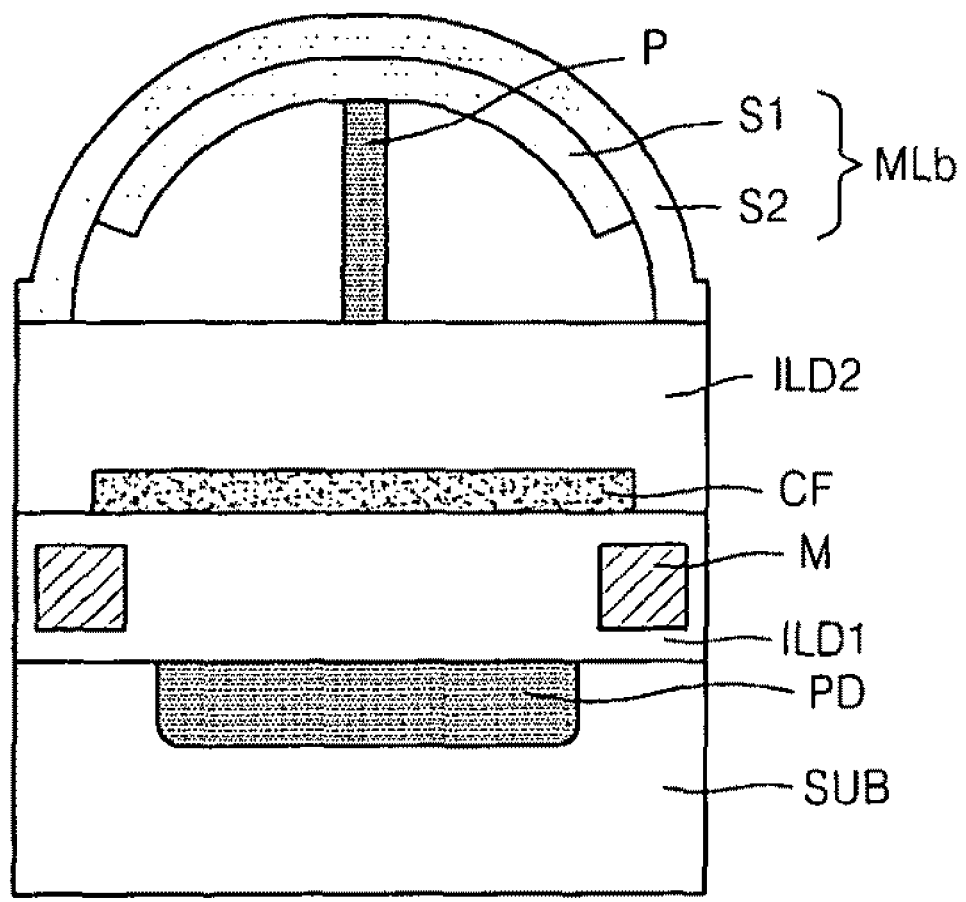

FIG. 18 is a diagram illustrating a partial cross-sectional view of an image sensor according to example embodiments.

Referring to FIG. 18, the image sensor includes a photodiode PD doped with impurities in a surface of a semiconductor substrate SUB. A first interlayer dielectric film $ILD_1$ is formed on the semiconductor substrate SUB including the photodiode PD. Metal wiring M may be provided in the first interlayer dielectric film $ILD_1$. A color filter layer CF is formed over the interlayer dielectric film ILD where the photodiode PD is formed. A second interlayer dielectric film $ILD_2$ is formed on the first interlayer dielectric film $ILD_1$ over the color filter layer CF. A polysilicon pattern P having a cylindrical shape is formed on a desired portion of the second interlayer dielectric film $ILD_2$. The polysilicon pattern P may be formed over a central portion of the second interlayer dielectric film $ILD_2$. The polysilicon pattern P may be formed over the photodiode PD. The polysilicon pattern P may be formed by the same method as the method for forming the polysilicon pattern P of FIG. 17C. A first shell portion $S_1$ for a round-type microlens having an edge separated from the second interlayer dielectric film $ILD_2$ is formed on an upper surface of the polysilicon pattern P. A second shell portion $S_2$ is formed on the first shell portion $S_1$ and the second interlayer dielectric film $ILD_2$. The first and second shell portions $S_1$ and $S_2$ form the microlens $ML_b$ of the second-type. The first and second shell portions $S_1$ and $S_2$ may be formed by the same method as the method for forming the first and second shell portions $S_{2-1}$ and $S_{2-2}$ according to the example embodiments described with reference to FIGS. 17A through 17D.

According to example embodiments, the dead zone may be decreased despite not having a perpendicular photodiode portion. If the width of the polysilicon pattern P is formed smaller than the width of the microlens, then the light blocked by the polysilicon pattern P may negligible because the width of the polysilicon pattern P may be controlled by the intensity of the excimer laser.

Because the capping film is formed over the silicon pattern poly-crystallized by ELA, the polysilicon pattern (having the cylindrical shape) for the photodiode is formed from the silicon pattern and simultaneously the shell portion for the round-type microlens is formed from the capping film.

Because the fundamental structure of the microlens is formed by swelling the capping film by ELA opposed to using the conventional photolithography and reflow processes, the dead zone may be reduced. The dead zone may be further reduced if the microlens is formed by adding the second shell portion to the first shell portion formed from the capping film.

According to other example embodiments, if the incident light is inclined, then the loss of light may be reduced because the perpendicular photodiode is provided in the lower center portion of the microlens.

In other example embodiments, because the efficiency of a lens increases, a material (e.g., a silicon oxide film) having a higher refractive index than the conventional photoresist film is used as a lens material.

Because the ELA process that concentrates a laser on the amorphous silicon pattern is used, a higher temperature process may not be necessary, decreasing the costs associated with higher temperature processes and/or property deterioration.

Although not illustrated, any well-known processes may be used in subsequent steps that are necessary to complete the manufacture of the image sensors according to example embodiments.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. For example, the structure of the image sensor according to example embodiments and a manufacturing method thereof can be used not only for a CMOS image sensor but also for a variety of image sensors. In some cases, the interlayer dielectric film may function as an overcoat layer to overcome step and/or adjust the focal length of a microlens. The constituent elements can be diverse as an overcoat layer, a protection layer, or a planarization layer is added. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a microlens, comprising:
   forming a silicon pattern on a semiconductor substrate having a lower structure;
   forming a capping film on the semiconductor substrate over the silicon pattern; and
   annealing the silicon pattern and the capping film to alter the silicon pattern to a polysilicon pattern having a cylindrical shape and the capping film to a shell portion for a round-type microlens.

2. The method of claim 1, wherein the silicon pattern is formed of amorphous silicon or polysilicon.

3. The method of claim 1, wherein the silicon pattern is formed having a width of 10 Å-50000 Å.

4. The method of claim 1, wherein the silicon pattern is formed having a thickness of 10 Å-50000 Å.

5. The method of claim 1, wherein the capping film is formed of silicon oxide or zirconium oxide.

6. The method of claim 1, wherein annealing includes excimer laser annealing.

7. The method of claim 6, wherein excimer laser annealing is performed at an intensity of 100 mJ/cm$^2$-3000 mJ/cm$^2$.

8. The method of claim 1, wherein the polysilicon pattern has a width less than a width of the silicon pattern and a height greater than a height of the silicon pattern.

9. The method of claim 1, further comprising filling an interior of the shell portion with a lens material through an opening between the semiconductor substrate and an edge of the shell portion formed while altering the capping film.

10. The method of claim 9, wherein the lens material is formed of silicon oxide or photoresist.

11. The method of claim 1, wherein the shell portion is a first shell portion, and the method further comprises forming a second shell portion for the microlens over the first shell portion.

12. The method of claim 11, wherein the second shell portion is formed of silicon oxide or zirconium oxide.

13. The method of claim 1, wherein forming the silicon pattern includes:
    forming an interlayer dielectric film having a contact hole on the semiconductor substrate; and
    forming a silicon plug in the contact hole and the silicon pattern on the contact hole and the interlayer dielectric film,
    wherein the capping film is formed on the interlayer dielectric film.

14. The method of claim 13, wherein the annealing is for the silicon plug, the silicon pattern, and the capping film, wherein the polysilicon pattern is formed from the silicon plug and the silicon pattern.

15. The method of claim 13, wherein the silicon plug is formed of amorphous silicon or polysilicon.

16. A method of manufacturing an image sensor, comprising:
    forming a first portion of a photodiode by doping impurities in a surface of a semiconductor substrate;
    forming a first interlayer dielectric film on the semiconductor substrate, the first interlayer dielectric film having a contact hole partially exposing the first portion of the photodiode;
    forming a silicon plug in the contact hole and a first silicon pattern on the contact hole and the first interlayer dielectric film, wherein the first silicon pattern has a first height and a width greater than a diameter of the contact hole;
    forming a first capping film on the first interlayer dielectric film over the first silicon pattern;
    annealing the first silicon pattern, the silicon plug and the first capping film to alter the first silicon pattern and the silicon plug to a first polysilicon pattern and the first capping film to a shell portion for a round-type first microlens, wherein the first polysilicon pattern has a second height greater than the first height and functions as a second portion of the photodiode; and
    forming a color filter layer on the shell portion.

17. The method of claim 16, wherein at least one of the silicon plug and the first silicon pattern is formed of amorphous silicon or polysilicon.

18. The method of claim 16, wherein the first silicon pattern is formed having a width of 10 Å-50000 Å.

19. The method of claim 16, wherein the first silicon pattern is formed having a thickness of 10 Å-50000 Å.

20. The method of claim 16, wherein the first capping film is formed of silicon oxide or zirconium oxide.

21. The method of claim 16, wherein annealing includes excimer laser annealing.

22. The method of claim 16, further comprising filling an interior of the shell portion with a lens material through an opening between the first interlayer dielectric film and an edge of the shell portion formed while altering the first capping film, prior to forming the color filter layer.

23. The method of claim 22, wherein the lens material filling the interior of the shell portion is silicon oxide or photoresist.

24. The method of claim 22, further comprising forming a second interlayer dielectric film on the first interlayer dielectric film over the shell portion, after filling the interior of the shell portion with the lens material and prior to forming the color filter layer.

25. The method of claim 16, wherein the shell portion is a first shell portion, and the method further comprises forming a second shell portion for the first microlens on the first shell portion and the first interlayer dielectric film, and
wherein the color filter layer is formed on the second shell portion.

26. The method of claim 25, wherein the second shell portion is formed of silicon oxide or zirconium oxide.

27. The method of claim 25, further comprising forming a second interlayer dielectric film on the first interlayer dielectric film over the second shell portion, after forming the second shell portion and prior to forming the color filter layer.

28. The method of claim 16, further comprising forming a second microlens on the color filter layer with a dielectric film interposed between the second microlens and the color filter layer.

29. The method of claim 16, further comprising:
forming a dielectric film on the first interlayer dielectric film over the color filter layer;
forming a second silicon pattern on the dielectric film over the first silicon pattern;
forming a second capping film over the second silicon pattern;
annealing the second silicon pattern and the second capping film to alter the second silicon pattern to a second polysilicon pattern having a cylindrical shape and the second capping film to a shell portion for a round-type second microlens; and
filling an interior of the shell portion for the second microlens with a lens material through an opening between the dielectric film and an edge of the shell portion for the second microlens formed while altering the second capping film.

30. The method of claim 16, further comprising:
forming a dielectric film on the first interlayer dielectric film over the color filter layer;
forming a second silicon pattern on the dielectric film over the first silicon pattern;
forming a second capping film over the second silicon pattern;
annealing the second silicon pattern and the second capping film to alter the second silicon pattern to a second polysilicon pattern having a cylindrical shape and the second capping film to a first shell portion for a round-type second microlens; and
forming a second shell portion for the second microlens on the first shell portion for the second microlens and the dielectric film around the first shell portion for the second microlens.

* * * * *